United States Patent [19]
Takahashi et al.

[11] Patent Number: 5,665,979
[45] Date of Patent: Sep. 9, 1997

[54] COULOMB-BLOCKADE ELEMENT AND METHOD OF MANUFACTURING THE SAME

[75] Inventors: Yasuo Takahashi; Masao Nagase; Akira Fujiwara, all of Kanagawa, Japan

[73] Assignee: Nippon Telegraph and Telephone Corporation, Japan

[21] Appl. No.: 746,654

[22] Filed: Nov. 13, 1996

Related U.S. Application Data

[62] Division of Ser. No. 546,529, Oct. 20, 1995, Pat. No. 5,604,154.

[30] Foreign Application Priority Data

Oct. 27, 1994 [JP] Japan .................................. 6-263809
Sep. 6, 1995 [JP] Japan .................................. 7-228872

[51] Int. Cl.$^6$ ............................ H01L 29/06; H01L 39/00
[52] U.S. Cl. .......................... 257/30; 257/9; 257/14; 257/23; 257/24; 257/38
[58] Field of Search .............................. 257/9, 14, 23, 257/24, 30, 38

[56] References Cited

PUBLICATIONS

Applied Physics Letters, vol. 64, No. 5, Jan. 31, 1994, pp. 586–588.
Patent Abstracts Of Japan, vol. 17, No. 431, Aug. 10, 1993.
IEEE Transactions On Electron Devices, vol. 41, No. 9, Sep. 1994, pp. 1628–1638.
Applied Physics Letters, vol. 61, No. 23, Dec. 7, 1992, pp. 2820–2822.
Physical Review Letters, vol. 65, No. 6, Aug. 6, 1990, pp. 771–774.
International Electron Devices Meeting Technical Digest, Dec. 14, 1994, pp. 938–940.
"Single-Electron Charging and Periodic Conductance Resonances in GaAs Nanostuctures" by U. Meirav, et al., Physical Review Letters, vol. 65, No. 6, 6 Aug. 1990, pp. 771–774.
"Room-Temperature Single-Electron Memory" by K. Yano, et al., IEEE Transactions on Electron Devices, vol. 41, No. 9, Sep. 1994, pp. 1628–1637.

*Primary Examiner*—Sara W. Crane
*Assistant Examiner*—Douglas Wille
*Attorney, Agent, or Firm*—Blakely Sokoloff Taylor & Zafman

[57] ABSTRACT

A Coulomb-blockade element includes a silicon layer formed on a substrate through an insulating film. The silicon layer includes a narrow wire portion and first and second electrode portions. The narrow wire portion serves as a conductive island for confining a charge. The first and second electrode portions are formed to be connected to the two ends of the narrow wire portion and are wider than the narrow wire portion. Each of the first and second electrode portions has constrictions on at least one of the upper and lower surfaces thereof, which make a portion near the narrow wire portion thinner than the narrow wire portion.

8 Claims, 21 Drawing Sheets

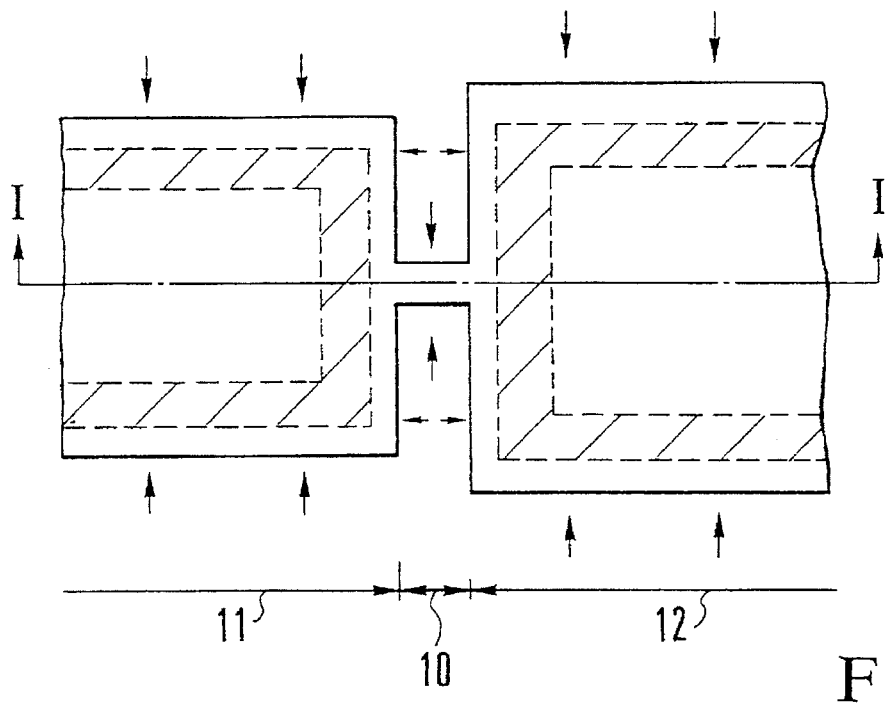
F I G. 2
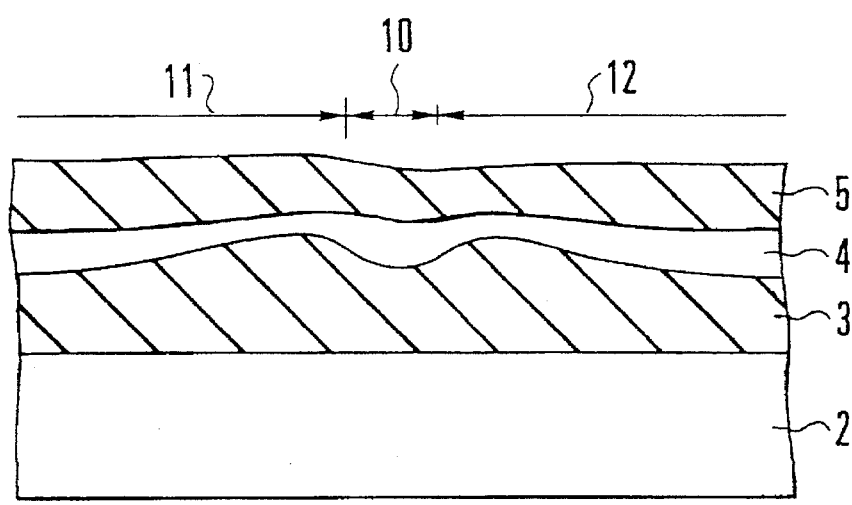
F I G. 3

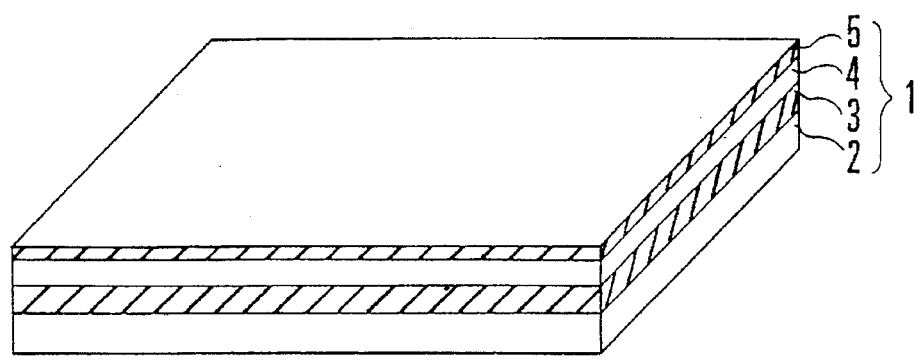
F I G. 14A
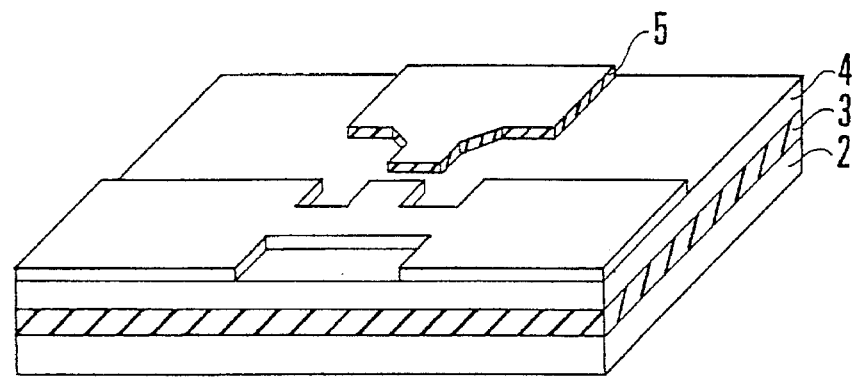
F I G. 14B
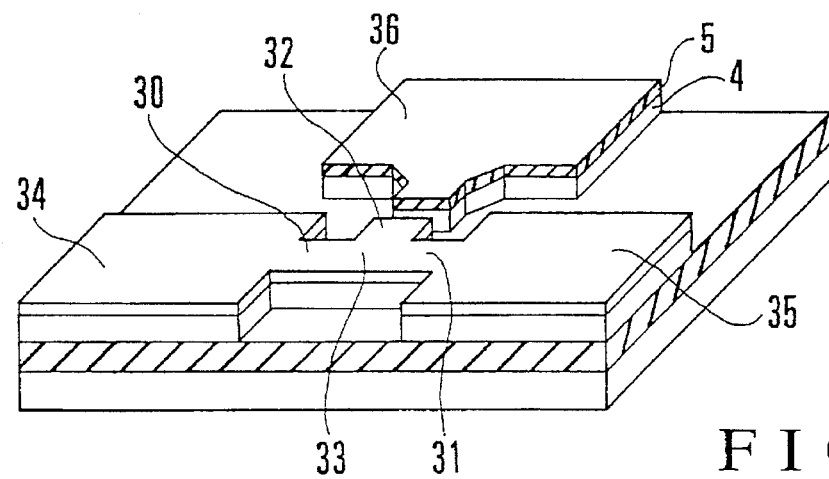
F I G. 14C

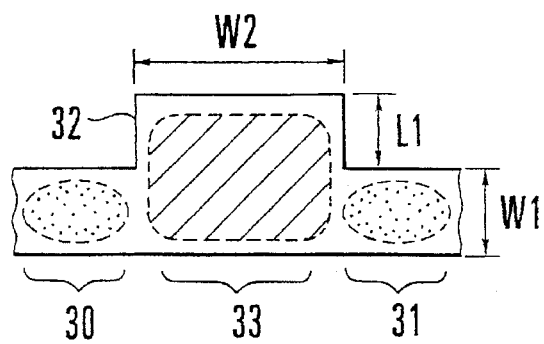 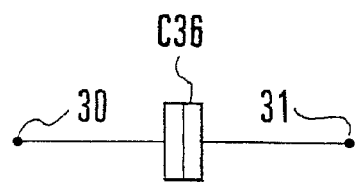
F I G. 19A          F I G. 19B
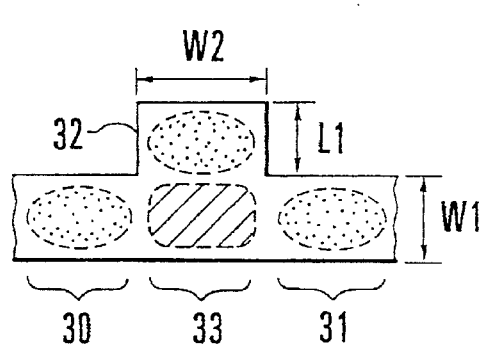 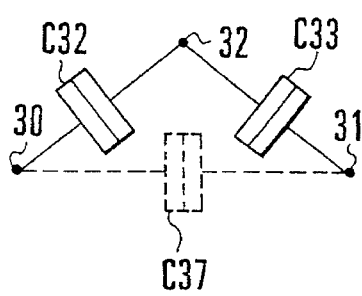
F I G. 19C          F I G. 19D
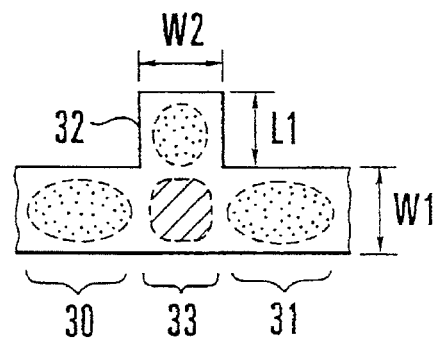 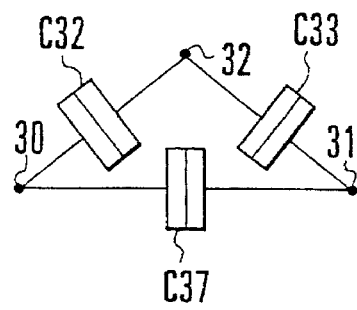
F I G. 19E          F I G. 19F

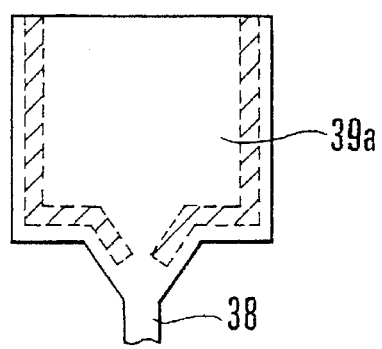 
FIG. 20A          FIG. 20B
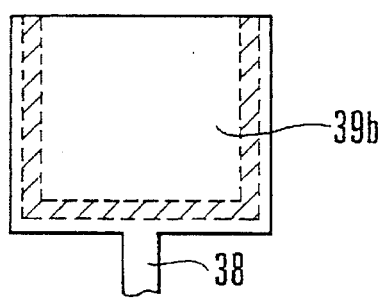 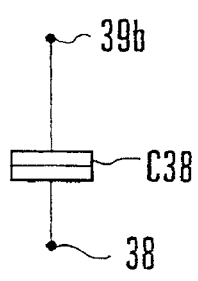
FIG. 20C          FIG. 20D
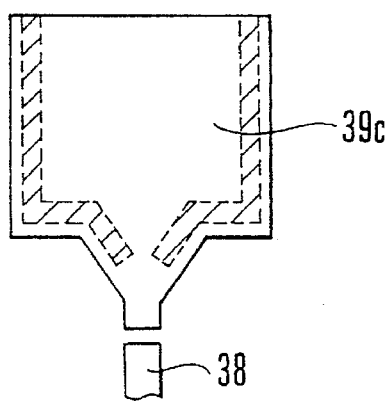 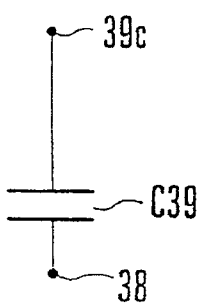
FIG. 20E          FIG. 20F

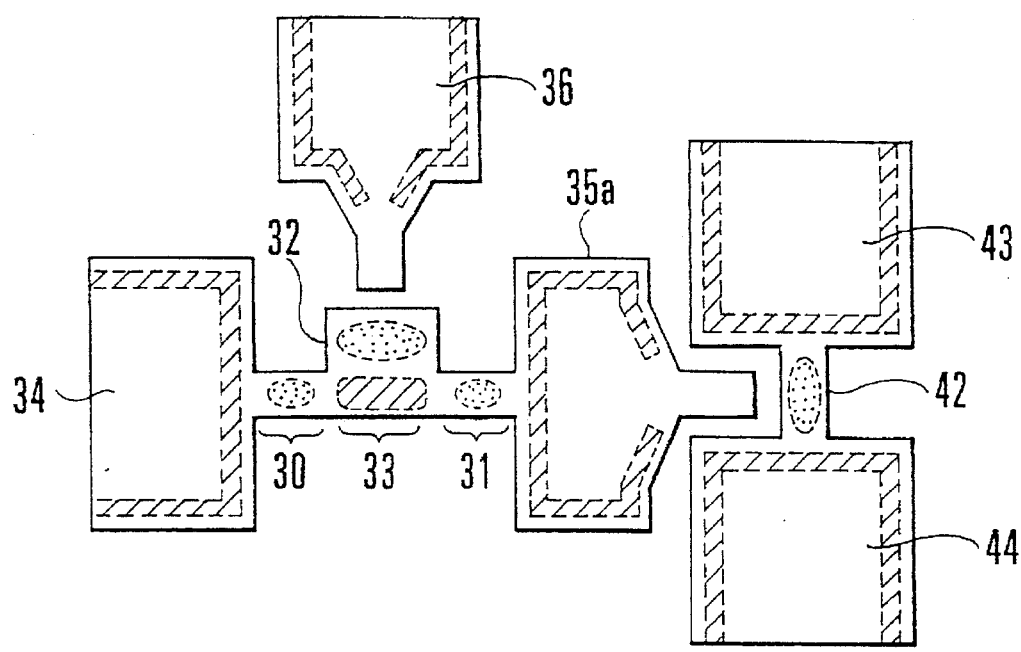
F I G. 22
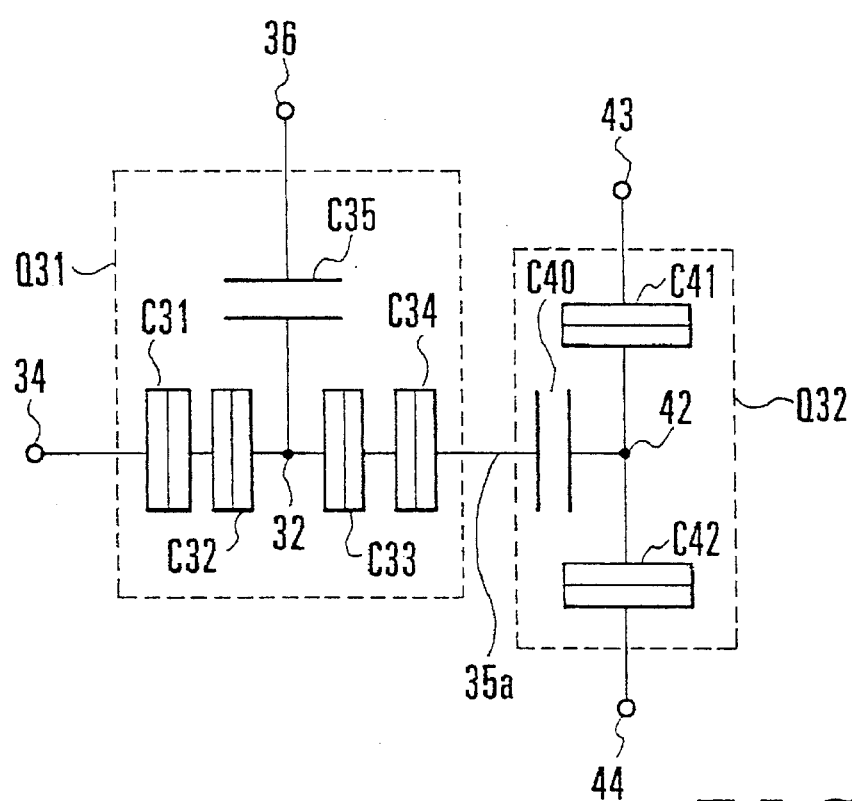
F I G. 23

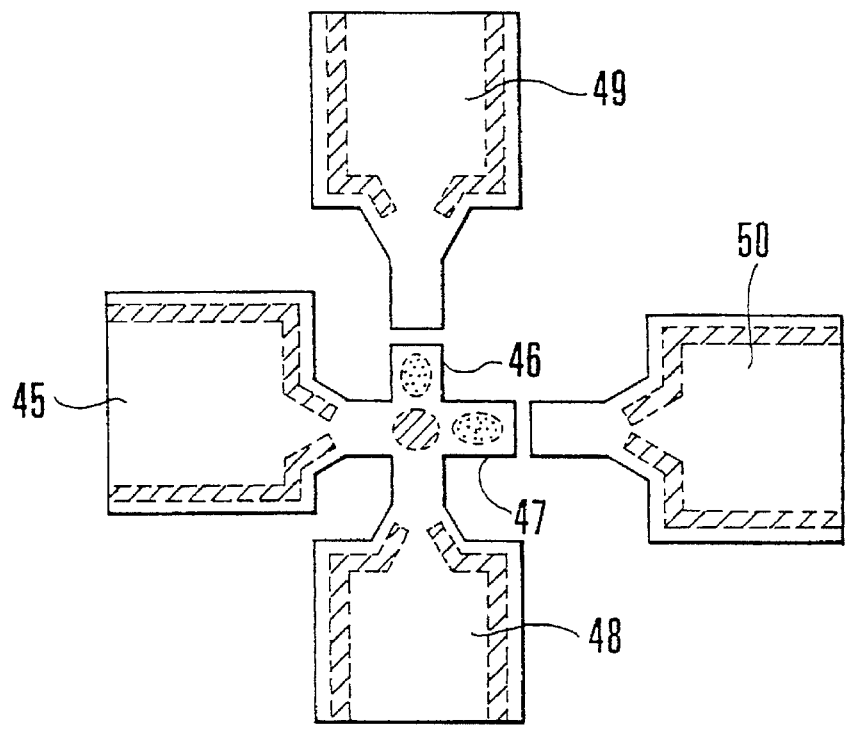
F I G. 24
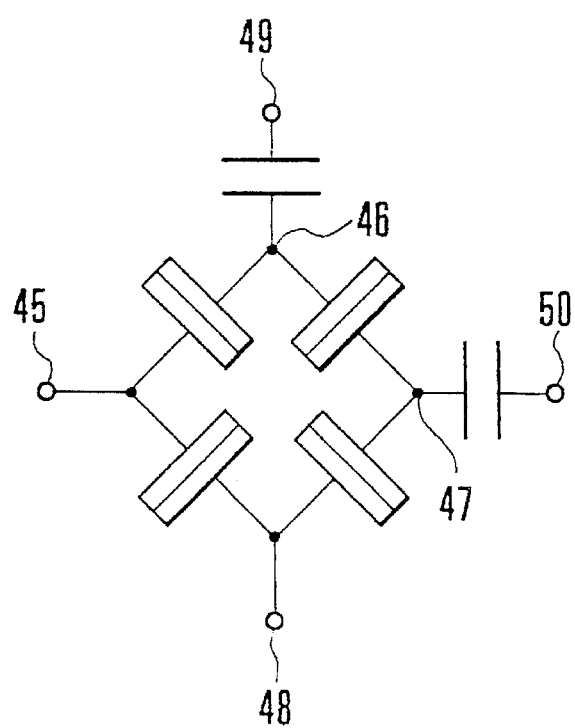
F I G. 25

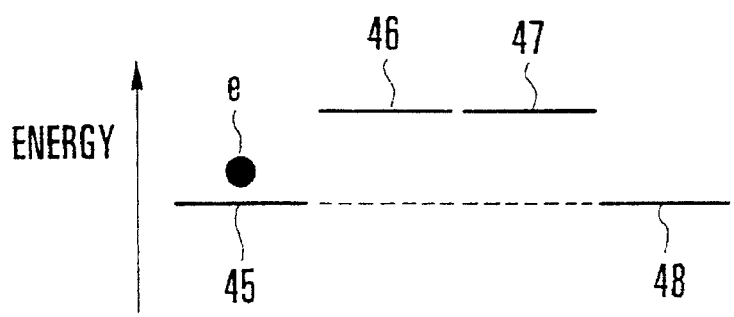
F I G. 26A
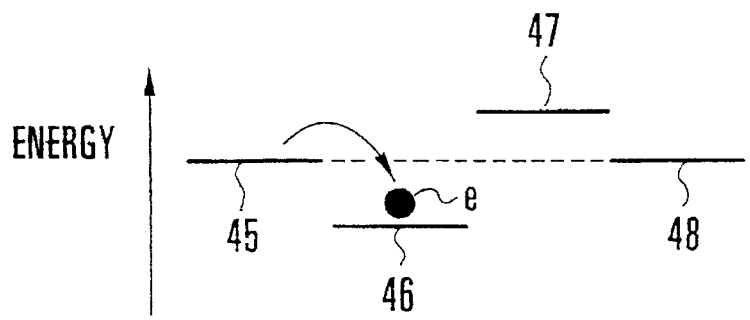
F I G. 26B
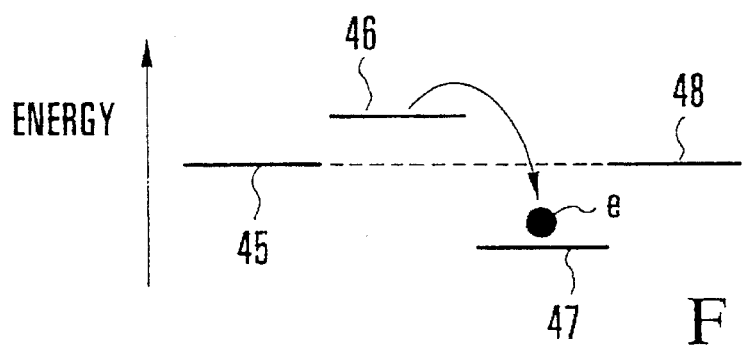
F I G. 26C
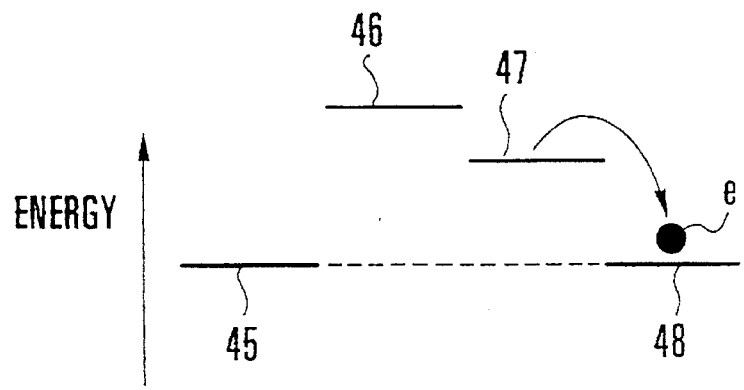
F I G. 26D

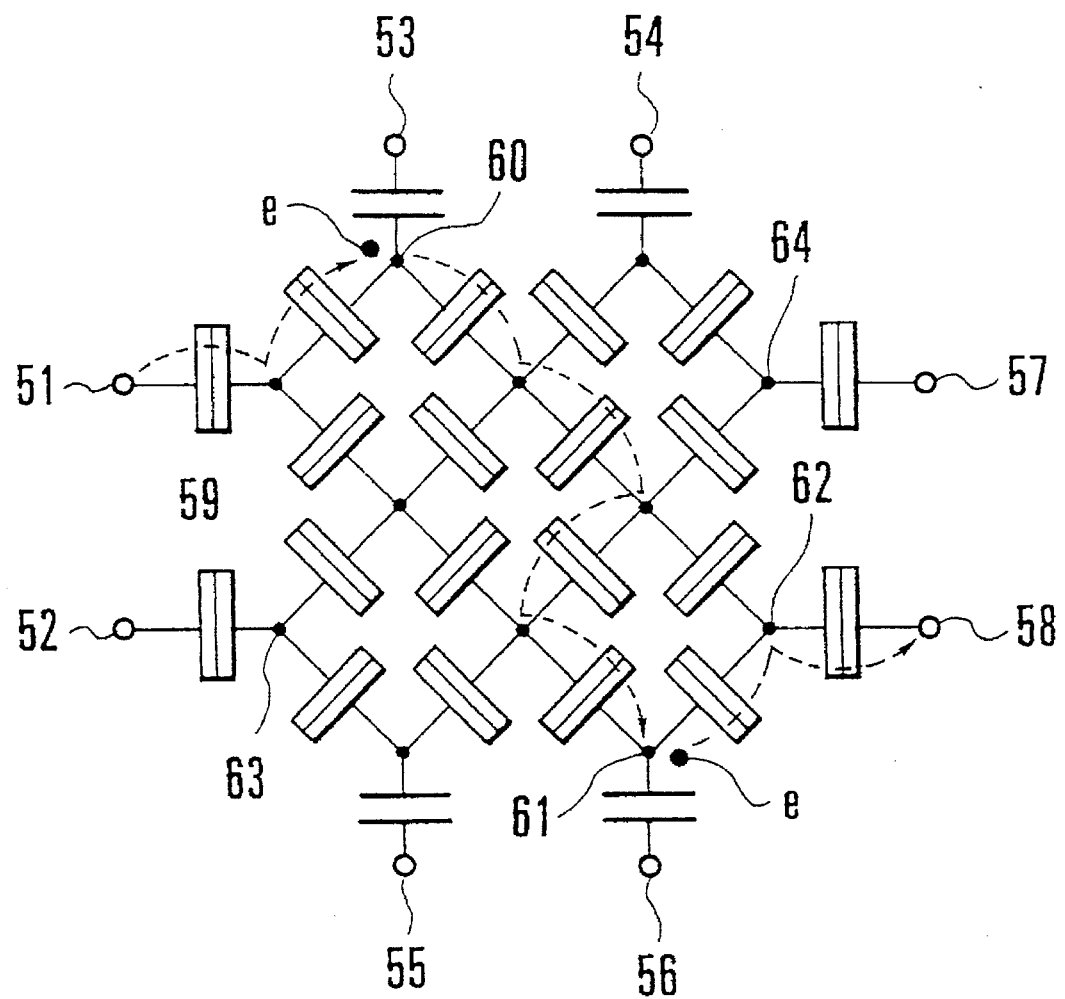
F I G. 29

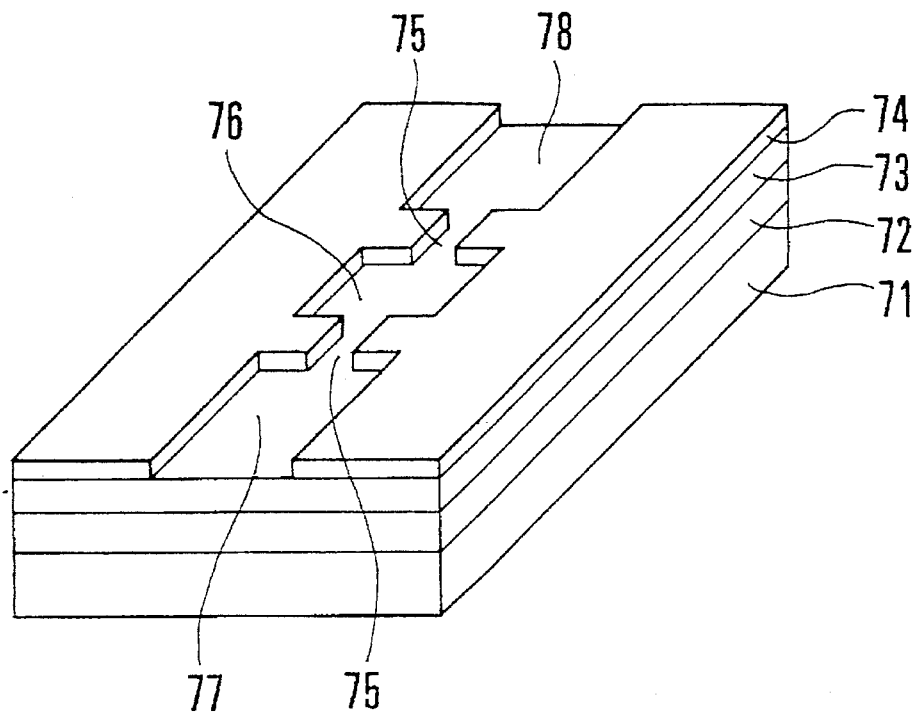
F I G. 31
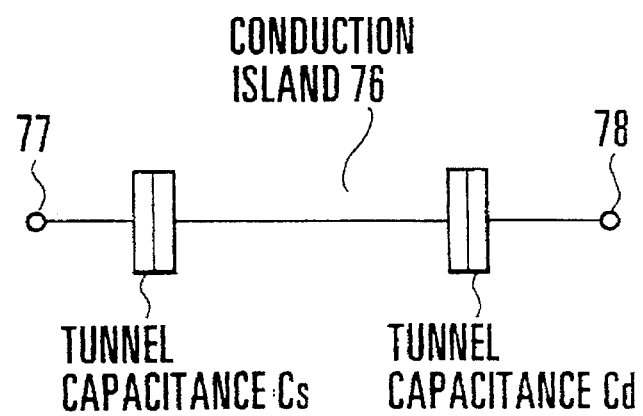
F I G. 32

COULOMB-BLOCKADE ELEMENT AND METHOD OF MANUFACTURING THE SAME

This is a divisional of application Ser. No. 08/546,529, filed Oct. 20, 1995, now U.S. Pat. No. 5,604,154.

BACKGROUND OF THE INVENTION

The present invention relates to an element using a Coulomb-blockade phenomenon and formed on a silicon substrate and a method of manufacturing the same.

A Coulomb-blockade phenomenon in electron tunneling at a small tunnel junction is a phenomenon in which tunneling of one electron is suppressed as free energy based on charging energy accompanying the tunneling increases. A Coulomb-blockade element using such a Coulomb-blockade phenomenon can control currents and charges flowing out from or stored in the element in units of electrons. For this reason, the power consumption per element is very small. In addition, the device area is also very small. Owing to these characteristics, an integration degree much higher than the integration limits of the existing silicon-based integrated circuits is expected. As the basic structure of this element, a single electron transistor or a single electron memory has been proposed.

Most of conventional Coulomb-blockade elements have a structure in which electrons are confined in a small metal island by using a small tunnel junction of a metal/metal oxide or a structure in which a two-dimensional electron gas formed at a heterojunction of a III–V compound semiconductor is confined in the form of an island by using an electric field generated by a narrow electrode or the like formed on the junction.

FIG. 31 shows the conventional Coulomb-blockade element disclosed in "Single-Electron Charging and Periodic Conductance Resonances in GaAs Nanostructures", U. Meirav et. al., Phys. Rev. Lett., Vol. 65, No. 6, pp. 771–774, 1990. FIG. 32 shows an equivalent circuit of this Coulomb-blockade element. Reference numeral 71 denotes a substrate consisting of n-type GaAs; 72, an AlGaAs layer; 73, a GaAs layer; and 74, an electrode formed on the GaAs layer 73.

In such a Coulomb-blockade element, a two-dimensional electrode gas is formed at the heterointerface between the AlGaAs layer 72 and the GaAs layer 73. Constrictions 75 which are constricted in the horizontal direction are formed on the electrode 74 to form potential barriers. A region 76 between these barriers becomes a conductive island for confining charges.

The potential barrier between the conductive island 76 and a source electrode 77 serves as a tunnel capacitance Cs. The potential barrier between the conductive island 76 and a drain electrode 78 serves as a tunnel capacitance Cd. As a result, an element having an equivalent circuit like the one shown in FIG. 32 is formed.

One of the most important subjects in putting such a Coulomb-blockade element to practical use is an operating temperature. In order to operate the Coulomb-blockade element at a practical temperature, a conductive island serving as an electron reservoir, which is the core of the element, must be formed on the nm scale, and a tunnel barrier having a very small capacitance of several aF (1 aF=$10^{-18}$ F) must be formed. This is because the charging energy of a single electron is buried in thermal energy as the sizes of these portions increase, and no Coulomb-blockade phenomenon can be observed.

Another important subject is how to manufacture and arrange such minute structures with good controllability. In order to realize a new function by coupling Coulomb-blockade elements, in particular, a manufacturing technique with good controllability is required.

In the Coulomb-blockade element shown in FIG. 31, the width (in the lateral direction in FIG. 31) of each constriction 75, where the gap in the electrode 74 is the smallest, must be sufficiently smaller than the width of the conductive island 76. For this reason, if the constriction 75 is to be manufactured by electron beam lithography, the size of the island 76 inevitably becomes much larger than the minimum dimensions determined by the lithography limit.

With regard to a Coulomb-blockade using a metal, since no effective working technique of forming a metal island is available, it is difficult to form a small metal island with good reproducibility.

Either of the elements having the above structures, therefore, can operate only at a very low temperature of 1 K or less.

A method of forming a conductive island by using fluctuations of a structure made of a thin polycrystalline material is known as an effective means for attaining a small capacitance (K. Yano et al., "Room-Temperature Single-Electron Memory", IEEE Trans. Electron Devices, Vol. 41, p. 1628, 1994). In this method, however, the position and the size of a conductive island cannot be arbitrarily controlled because fluctuations caused by a polycrystalline structure are used.

As described above, in the conventional methods, a technique of manufacturing a very small conductive island and a technique of positioning the conductive island with good reproducibility have not been established. These techniques are indispensable for putting a Coulomb-blockade element to practical use. Therefore, a Coulomb-blockade element which can operate at room temperature cannot be realized with good controllability and good reproducibility.

SUMMARY OF THE INVENTION

It is, therefore, a principal object of the present invention to provide a Coulomb-blockade element which can be manufactured by a simple manufacturing process and can operate at high temperatures, and a method of manufacturing the same.

In order to achieve the above object, according an aspect of to the present invention, there is provided a Coulomb-blockade element comprising a silicon layer formed on a substrate through an insulating film, the silicon layer including a narrow wire portion serving as a conductive island for confining a charge, and first and second electrode portions which are formed to be connected to two ends of the narrow wire portion and are wider than the narrow wire portion, each of the first and second electrode portions having constrictions on at least one of upper and lower surfaces thereof, which make a portion near the narrow wire portion thinner than the narrow wire portion.

According to another aspect of the present invention, there is provided a method of manufacturing a Coulomb-blockade element comprising the step of processing a silicon layer formed on a substrate through an insulating film into a shape including a narrow wire portion serving as a conductive island for confining a charge, and first and second electrode portions at two ends of the narrow wire portion, each of the first and second electrode portions being wider than the narrow wire portion, and the thermal oxidation step of thermally oxidizing the silicon layer, the first and second electrode portions being formed to be thinner than the narrow wire portion at positions near the narrow wire portion.

BRIEF DESCRIPTION OF THE DRAWINGS

FIG. 2 is a plan view showing the pattern of a silicon layer;

FIG. 3 is a sectional view taken along a line I—I of FIG. 2 illustrating the element after thermal oxidation in FIG. 1C;

FIGS. 14A to 14C are sectional views showing the steps in manufacturing a Coulomb-blockade element according to still another embodiment of the present invention;

FIGS. 19A to 19F are plan views and equivalent circuit diagrams for explaining the formation of silicon islands and control of the degree of coupling between the silicon island;

FIGS. 20A to 20F are plan views and equivalent circuit diagrams for explaining control of the forms of the junctions between electrodes;

FIG. 22 is a plan view showing a coulomb-blockade element according to still another embodiment of the present invention;

FIG. 23 is an equivalent circuit diagram of the Coulomb-blockade element in FIG. 22;

FIG. 24 is a plan view showing a Coulomb-blockade element according to still another embodiment of the present invention;

FIG. 25 is an equivalent circuit diagram of the Coulomb-blockade/element in FIG. 24;

FIGS. 26D to 26D are views showing the energy diagram for a single electron between narrow wire portions and electrode portions;

FIG. 29 is an equivalent circuit diagram of the Coulomb-blockade element in FIG. 28;

FIG. 31 is a perspective view showing a conventional Coulomb-blockade element when viewed obliquely from above; and FIG. 32 is an equivalent circuit diagram of the Coulomb-blockade element in FIG. 31.

DESCRIPTION OF THE PREFERRED EMBODIMENTS

First Embodiment

Figure 1A:
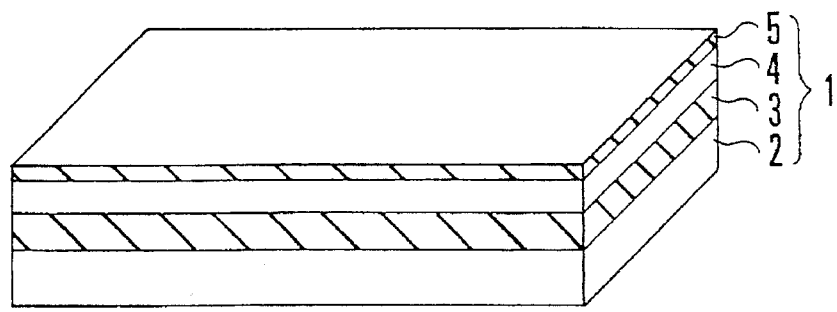
FIGS. 1A to 1D sectional views showing the steps in manufacturing a Coulomb-blockade element according to the first embodiment of the present invention.

FIGS. 1A to 1D show the steps in manufacturing a Coulomb-blockade element according to the first embodiment of the present invention.

Referring to FIGS. 1A to 1D, reference numeral 1 denotes an SOI (Silicon On Insulator) substrate 1 obtained by forming a monocrystalline silicon layer on an insulating film; 2, a silicon substrate; 3, a buried oxide film on the silicon substrate 2; 4, an upper silicon layer on the oxide film 3; 5, a silicon oxide film formed on the upper surface of the upper silicon layer 4 of the SOI substrate 1 upon oxidation of the upper silicon layer 4; and 6, a gate electrode. The SOI substrate 1 is therefore constituted by the silicon substrate 2, the oxide film 3, the upper silicon layer 4, and the silicon oxide film 5.

The steps in manufacturing the Coulomb-blockade element of this embodiment will be described first. An SOI substrate to be used includes, for example, a SIMOX (Separation by IMplanted OXygen) substrate having an oxide film formed by implanting oxygen into a monocrystalline silicon substrate and a substrate formed by bonding a silicon oxide film and a monocrystalline silicon layer together.

First of all, the silicon oxide film 5 is formed on the upper silicon layer 4 of the SOI substrate 1 constituted by the silicon substrate 2, the oxide film 3, and the upper silicon layer 4 by thermal oxidation or the like (FIG. 1A).

Figure 1B:
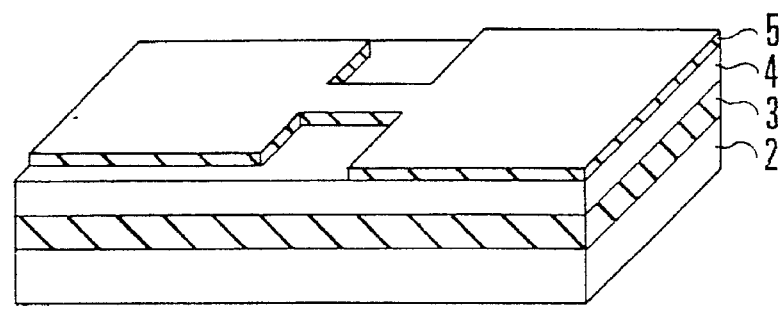

The silicon oxide film 5 is then processed into a pattern like the one indicated by the solid lines in FIG. 2, when viewed from above, by RIE (Reactive Ion Etching) (FIG. 1B).

Figure 1C:
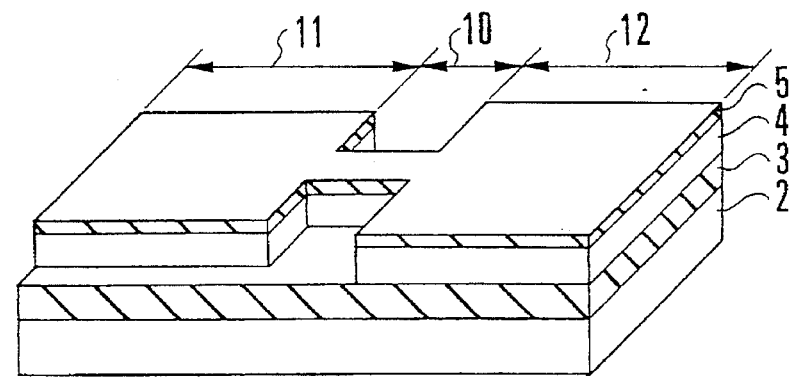

The upper silicon layer 4 is etched by a reactive ion etching or electron cyclotron resonance (ECR) etching method using the silicon oxide film 5 as a mask. With this process, as shown in FIG. 1C, the upper silicon layer 4 is left only under the silicon oxide film 5.

In this manner, the upper silicon layer 4 is processed into a shape including a narrow wire portion 10 and source- and drain-side electrode portions 11 and 12 respectively serving as first and second electrode portions, each having a larger width (in the vertical direction in FIG. 2) than the narrow wire portion 10.

In this case, the width of the narrow wire portion 10 is preferably set on the order of the thickness of the upper silicon layer 4 (i.e., about 1/10 to 10 times the thickness thereof).

When the resultant structure is thermally oxidized in an atmosphere including oxygen and water vapor, the upper silicon layer 4 is oxidized from its upper surface upon diffusion of an oxidant (oxygen or water) through the silicon oxide film 5. In addition, the pattern edges (the outer peripheral portions in FIG. 2) and adjacent portions are oxidized from their side or lower surfaces upon diffusion of the oxidant through the side surfaces of each pattern and the upper silicon layer 4 itself or diffusion of the oxidant through the buried oxide film 3.

At this time, oxidation from the upper side through the silicon oxide film 5 progresses at an almost constant rate. In contrast to this, since the diffusion amount of the oxidant through the oxide film 3 is in inverse proportion to the distance (or the square of the distance) from each pattern edge, oxidation from the buried oxide film 3 side upon diffusion of the oxidant in the lateral direction progresses more as the distance from the edge decreases.

In each pattern edge, however, the oxidant concentration decreases due to the accumulation of stress upon volume expansion of the oxide film formed by thermal oxidation. For this reason, the oxidation rate is suppressed. In a region having a small area, such as the narrow wire portion 10 (which may be regarded as a pattern edge as a whole), since the upper silicon layer 4 is surrounded by the oxide film formed by thermal oxidation with the progress of oxidation from the two side walls, the above oxidation suppressing effect is especially enhanced.

With regard to the upper surface of the upper silicon layer 4, therefore, owing to this oxidation suppressing effect, oxidation of each pattern edge is suppressed, and oxidation of the narrow wire portion 10 is suppressed more. As a result, oxidation progresses at an almost constant rate in the remaining regions.

Similarly, with regard to the lower surface of the upper silicon layer 4, oxidation of the narrow wire portion 10 and the remaining pattern edges is suppressed, and oxidation considerably progresses in regions adjacent to the pattern edges owing to the above oxidation progressing effect.

In this manner, the oxidation rate near the pattern edge of each of the electrode portions 11 and 12 becomes the highest, and hence the upper silicon layer 4 in this region is thinnest.

When this element is cut along a line I—I in FIG. 2, a structure like the one shown in FIG. 3 is obtained.

Figure 1D:
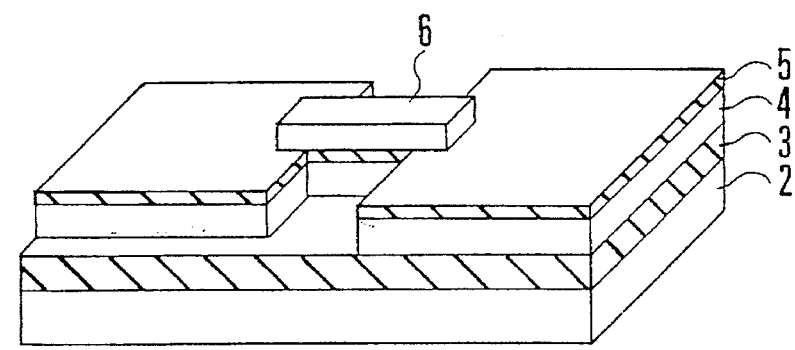

Subsequently, the gate electrode 6 made of polysilicon or the like is formed on the narrow wire portion 10 to cover it (FIG. 1D). The silicon oxide film 5 formed on the upper silicon layer 4 is therefore used as a gate oxide film.

Similar to a conventional MOS transistor, windows for electrodes are formed in portions of the silicon oxide film 5 on the electrode portion 11 and the electrode portion 12, and source and drain electrodes are formed in these windows by using a metal such as aluminum, tungsten, or titanium for extraction electrodes.

With this step, the manufacturing process for a Coulomb-blockade element is completed.

As described above, if the two ends of the narrow wire portion 10 having undergone oxidation are sufficiently thinner than the upper silicon layer 4, the conduction band of the semiconductor silicon in each of these thin regions is quantized. As a result, the ground energy state becomes higher than that of the narrow wire portion 10. For this reason, the two ends of the narrow wire portion 10 are located between the energy barriers, and the portion looks like an isolated island from the viewpoint of electrons in the narrow wire portion 10.

Figure 4:
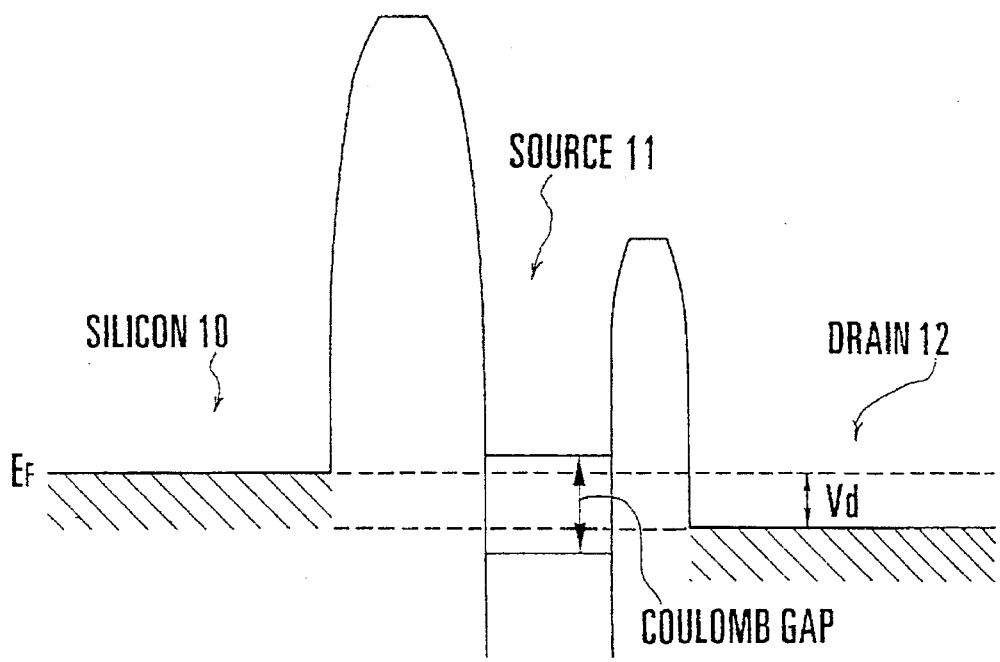
FIG. 4 is an energy band diagram illustrating the principle of the Coulomb-blockade element in FIG. 1.
Figure 5:
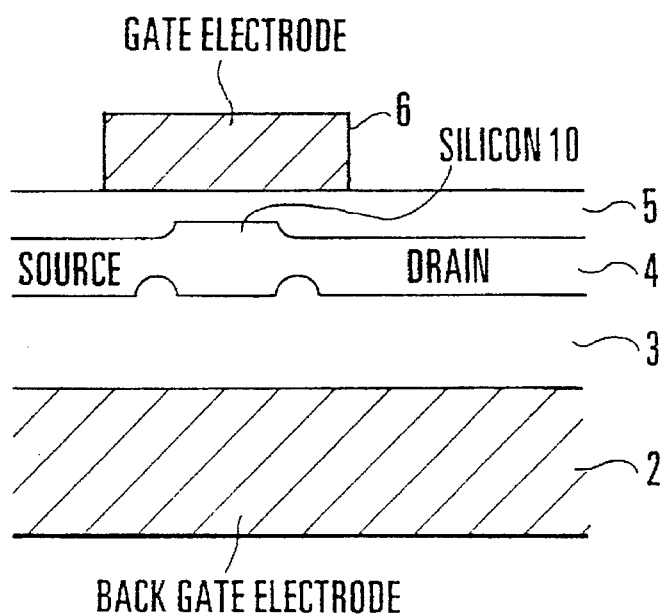
FIG. 5 is a sectional view showing the Coulomb-blockade element in FIG. 1.
Figure 6:
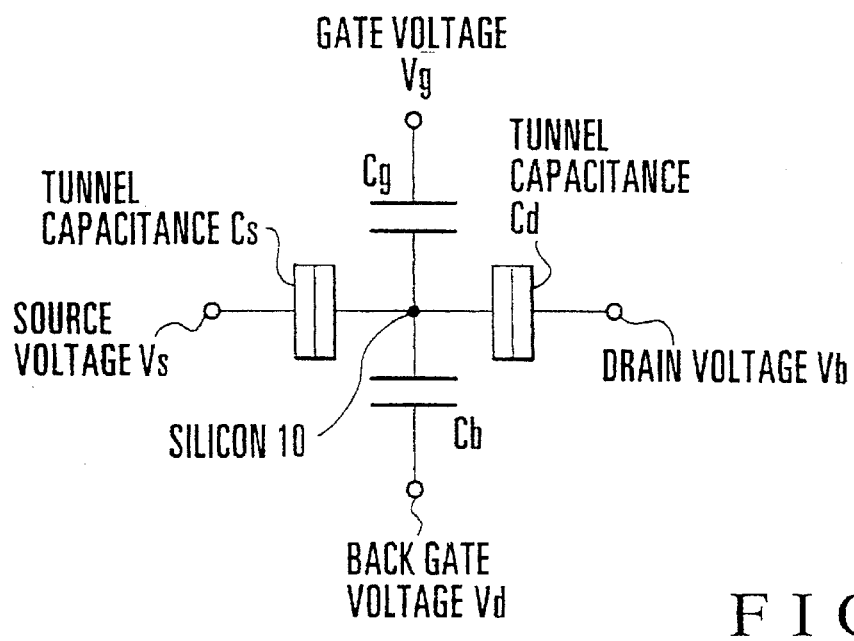
FIG. 6 is an equivalent circuit diagram of the Coulomb-blockade element in FIG. 1.

FIG. 4 illustrates this energy band diagram. FIG. 5 illustrate a Coulomb-blockade element. FIG. 6 shows an equivalent circuit of the element. Note that FIG. 4 is associated with only the conduction band.

The very thin silicon regions near the pattern edges of the electrode portions 11 and 12 become potential barriers (tunnel barriers) like those shown in FIG. 4 when the above ground energy state increases. These two potential barriers serve to confine charges in the narrow wire portion 10, and also serve as a tunnel capacitance Cs (source-side capacitance) and a tunnel capacitance Cd (drain-side capacitance), respectively. In this manner, the narrow wire portion 10 becomes a silicon island (conductive island).

Capacitances Cg and Cb for the gate electrode 6 and the silicon substrate 2 are connected to the narrow wire portion 10.

The silicon layer 4 in FIG. 5 and the actual silicon layer 4 in FIG. 3 differ in shape for the following reason. The two ends of the narrow wire portion 10 decrease in thickness from the upper and lower surface sides, and the narrow wire portion 10 has a shape like the one shown in FIG. 5. In practice, however, the narrow wire portion 10 is pushed upward from below because of the volume expansion of the oxide film due to the above oxidation progressing effect.

Figure 7:
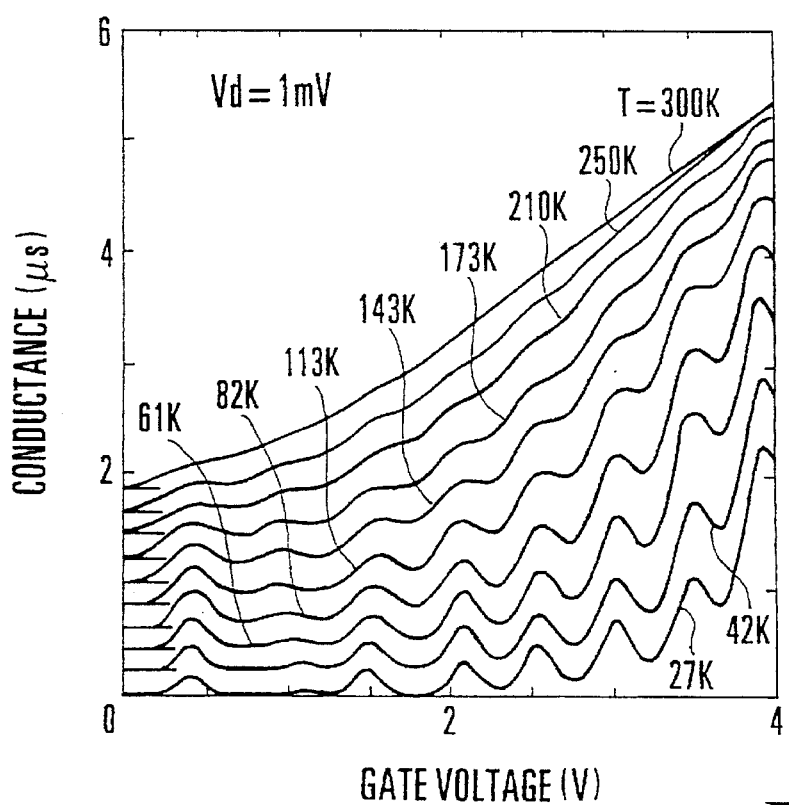
FIG. 7 is a graph showing the characteristics of the Coulomb-blockade element in FIG. 1.

FIG. 7 shows the characteristics of the Coulomb-blockade element of this embodiment. FIG. 7 shows a change in source-drain conductance with a temperature being a parameter when the source electrode and the silicon substrate 2 (back gate) of the Coulomb-blockade element are grounded, a drain voltage Vd is set to be 1 mV, and a gate voltage Vg is changed. In order to show the characteristics clearly, the characteristic curves are sequentially translated upward 0.2 µs at a time except for the characteristic curve at 27K (in practice, when the gate voltage is 0 V, the conductance at each temperature is almost 0 µs).

In this Coulomb-blockade element, the width and length (in the lateral direction in FIG. 2) of the narrow wire portion 10 are respectively set to be about 30 nm and about 50 nm; the width of the electrode portion 11, about 400 nm; the width of the electrode portion 12, about 1,000 nm; the thickness of the silicon layer 4 before the thermal oxidation step in FIG. 1C, about 30 nm; and the thickness of the upper silicon oxide film 5, about 30 nm. This structure is thermally oxidized under the conditions (in a dry oxygen atmosphere at 1,000° C. for about 90 min.) for oxidizing the narrow wire portion 10 from one side by about 10 nm or more.

When the above structure is processed under such conditions, the thickness of the upper silicon layer 4 of the narrow wire portion 10 becomes 10 nm, and the thickness of the upper silicon layer 4 near the pattern edges of the electrode portions 11 and 12 (each thinnest portion will be referred to as a constriction hereinafter) becomes 5 nm or less. As a result, an element having gate capacitance Cg=0.3 aF, drain capacitance Cd=1 aF, and back gate capacitance Cb=0.01 aF is formed. The source capacitance Cs cannot be directly measured, but is smaller than the drain capacitance Cd.

With the use of the structure of this embodiment, the capacitance around the silicon island in the center of the structure can be reduced, and oscillations caused by the gate voltage of the conductance can be observed even at room temperature (i.e., the basic operation of the single-electron transistor can be observed).

This operation will be described below with reference to FIG. 4. Since the silicon island is surrounded by the small capacitance as described above, a charging energy increase acquired when one electron enters the island. As a result, energy levels with an energy gap are set in the silicon is and (FIG. 4 shows only the two levels above and below the Coulomb gap).

When the gate voltage Vg is changed, the gate electrode 6 and the island are capacitively connected to each other. As a result, these energy levels move up and down while a constant gap therebetween is kept.

When the levels of the source and the drain are set inside the Coulomb gap while the voltage Vd between the source and the drain is lower than the gap, a blockage state is set, in which no current flows between the source and the drain.

When any one of the levels of the Silicon island is set between the energy levels of the source and the drain, a current flow from the source to the drain through this level.

When, therefore, the gate voltage Vg is changed, the above two states alternately appear, and hence the conductance between the source and the drain pulsates.

Since this conductance pulsation is obscured by thermal energy at temperatures other than the temperature of absolute zero, the pulsation is observed as a smooth oscillation, as shown in FIG. 4.

As the total capacitance around the silicon island decreases, the Coulomb gap of the silicon island increases. For this reason, this conductance oscillation can be observed up to high temperatures.

A preferable condition for realizing such a Coulomb-blockade element is that the dimensions of the narrow wire portion 10 before thermal oxidation, including thickness, width, and length, are set to be about several tens nm or less.

Although any one of the two ends of the narrow wire portion 10 may be formed into a source electrode, the silicon layer 4 at the two ends is made thin to a considerable degree as the width of the silicon layer 4 decreases to a certain degree. This is because the main principle of oxidation of the silicon layer 4 is that the silicon layer 4 is oxidized from its lower surface side upon diffusion of an oxidant in the lateral direction through the buried oxide film 3. That is, the amount of oxidant to the lower surface of the silicon layer 4 increases as the distance from an edge of the silicon layer 4 decreases to a certain degree or a gap at a certain distance from the edge increases. Therefore, as the width of the silicon layer 4 decreases, the amount of oxidant supplied from the two ends in the direction of width (the upper end lower ends in FIG. 2) to the silicon layer 4 increases.

If, however, the width of the silicon layer 4 excessively decreases, the stress concentrates on the edge of the silicon layer 4 in the oxidation step. As a result, the oxidation rate decreases. The silicon layer 4 therefore needs to have a certain width. This width is dependent on the film thickness or the oxidation condition, but needs to be 100 nm to 200 nm or more. Even if the upper limit of the width is set to be infinite, the oxidation rate at each narrow wire portion end may increase. If, however, the width is excessively large, this effect is reduced. A careful consideration is therefore required for this point.

The width that allows the most effective progression of oxidation depends on conditions such as an oxidation temperature and an oxidation atmosphere. Assume that oxidation is to be performed in a dry oxygen atmosphere at 1,000° C. In this case, when the width is set to be about 400 nm, oxidation progresses most effectively from the lower surface side of the silicon layer 4. According to the structure of the element having the characteristics in FIG. 7, since the width on the source side is as small as 400 nm, the thickness of the silicon layer 4 on the electrode 11 side is smaller than that on the electrode 12 side, as shown in FIG. 3.

Consequently, as shown in FIG. 4, the confining potential based on a rise in ground energy state with a decrease in the thickness of the silicon layer 4 is larger on the source side (11) than on the drain side (12). With an increase in potential, the effective distance between the electrode and the silicon island increases. The tunnel capacitance on the source side is therefore smaller than that on the drain side.

That is, if the electrode portions 11 and 12 are made asymmetrical in terms of width, a dimensional relationship can be established between the electrode portions 11 and 12. As is apparent, the electrode portions 11 and 12 may be made symmetrical in terms of width.

In this manner, the formation of a constriction where the silicon layer 4 is made thinnest can be controlled by the widths and thicknesses of the electrode portions 11 and 12 and thermal oxidation conditions (oxidation temperature and oxidation time). That is, since the magnitude of a confining potential and the size of a tunnel capacitance can be adjusted, the capacitance round the silicon island can be reduced.

In addition, of the silicon LSI process techniques, the thermal oxidation technique is especially superior in controllability and reproducibility. Therefore, the structure of the Coulomb-blockade element of this embodiment can be realized with good controllability and good reproducibility.

The dimensions of the silicon island, i.e., the width and length of the narrow wire portion 10, can be set regardless of the size of each constriction. That is, the silicon island can be formed with a size corresponding to the limit of lithography. Furthermore, since the silicon of the narrow wire portion 10 can be narrowed upon thermal oxidation, the silicon island can be reduced in size below the limit of lithography, thereby effectively reducing the total capacitance of the island.

If the buried oxide film 3 is slightly etched (by about several nm to several tens nm) from a slit portion (an etched portion of the upper silicon layer) before thermal oxidation by using an aqueous HF solution or the like, oxidation from the lower surface of the silicon layer 4 can be more effectively made to progress. If, however, the oxide film 3 is excessively etched, oxidation occurs uniformly from the lower surface in a wide range, and the silicon layer 4 cannot be thinned in a narrow region. As a result, stricter conditions are required to form tunnel barriers.

The gate electrode 6 need not always be stacked on the narrow wire portion 10. As is apparent, for example, the gate electrode 6 may be formed beside (the upper or lower side in FIG. 2) the narrow wire portion, or the silicon substrate 2 on the lower surface may be used as a substitute.

When the gate electrode 6 is formed beside the narrow wire portion 10, since a silicon oxide film is formed beside the narrow wire portion 10 in the thermal oxidation step in FIG. 1C, this film is used as a gate oxide film.

In this structure, the wide electrode portion attached to the silicon island serves as an electrode for transferring a voltage and a current. Therefore, as this electrode portion becomes wider, the resistance decreases.

Second Embodiment

In the first embodiment, the simple structure of the Coulomb-blockade element indicated by the equivalent circuit diagram of FIG. 6 and the method of manufacturing the same have been described. As an improved example of this structure, a simple structure for attaining a memory function will be described next.

Figure 8:
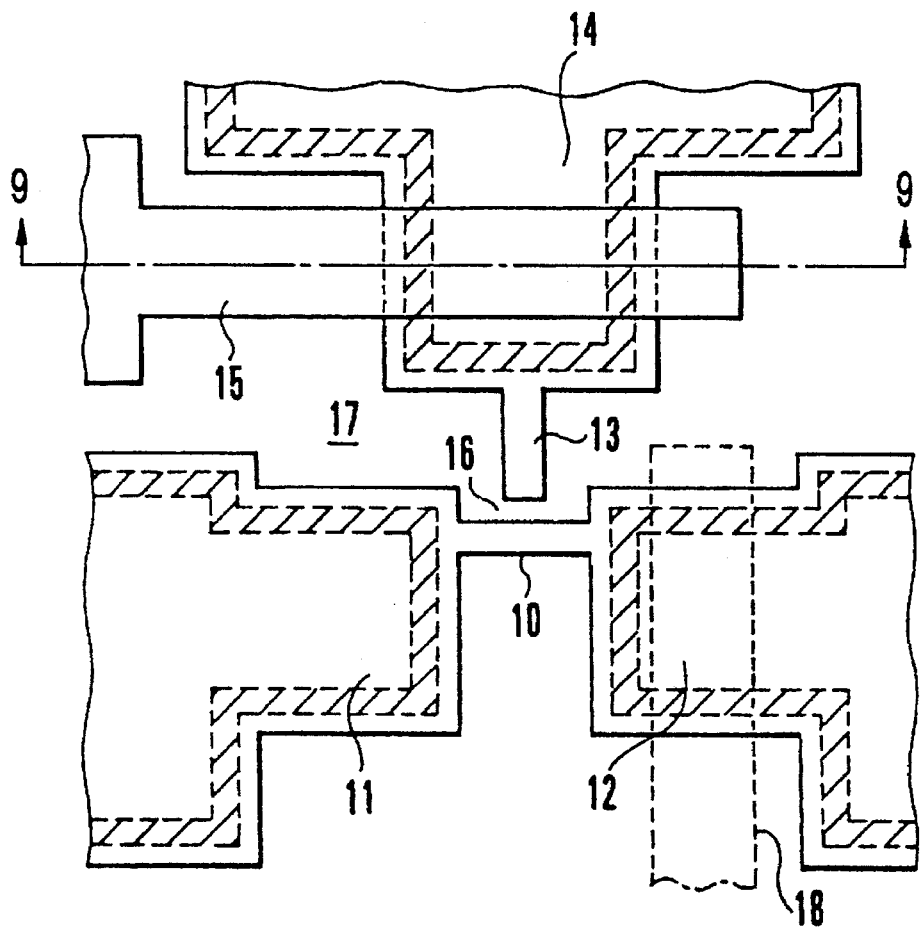
FIG. 8 is a plan view showing a Coulomb-blockade element according to another embodiment of the present invention.

FIG. 8 shows a Coulomb-blockade element according to another embodiment of the present invention. FIG. 8 shows only an upper silicon layer corresponding to the silicon layer 4 in FIG. 1 and a gate electrode.

Referring to FIG. 8, reference numeral 14 denotes a third electrode portion which is spaced apart from a narrow wire portion 10 through a space or an insulating film for a capacitance and is to be formed into the drain, source, and channel regions of a MOS transistor; and 15, the gate electrode of the MOS transistor.

The steps in manufacturing such a Coulomb-blockade element will be described next.

First of all, similar to the first embodiment, an upper silicon layer on an SOI substrate is processed into a shape including the narrow wire portion 10 and first and second electrode portions 11 and 12, each having a width of about 100 nm or more.

At the same time, the upper silicon layer adjacent to this structure is processed into a shape including an adjacent portion 13 adjacent to the narrow wire portion 10 and the third electrode portion 14 having a width of about 100 nm or more.

The narrow wire portion 10 and the adjacent portion 13 may be spaced apart from each other through a space 16 or an insulating film such as a silicon oxide film. Alternatively, since the adjacent portion 13 constitutes a portion of the electrode portion 14, the electrode portion 14 may be formed to be adjacent to the narrow wire portion 10 without forming the adjacent portion 13.

In this case, conditions may be set such that a capacitance (a capacitance C16 to be described later) to be formed between the narrow wire portion 10 and the third electrode portion 13 is on the order of tunnel capacitances Cs and Cd (i.e., about 1/10 to 10 times the capacitances Cs and Cd).

When this silicon layer is thermally oxidized in the same manner as in the first embodiment, the hatched portions of the silicon layer in FIG. 8 are made thinnest, and tunnel barriers are formed in these regions. As a result, a silicon island is formed on the narrow wire portion 10.

Figure 9:
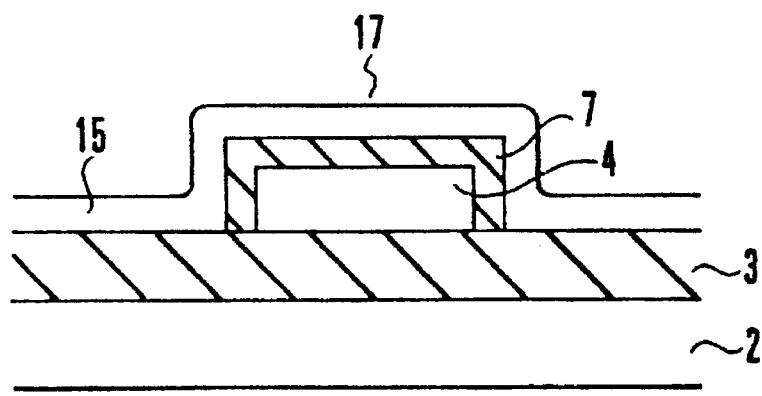
FIG. 9 is a sectional view taken along a line II—II of FIG. 8.

The first gate electrode 15 made of conductive polysilicon is formed on the electrode portion 14 to partly cover it. When this structure is cut along a line II—II in FIG. 8, a structure like the one shown in FIG. 9 is obtained. Referring to FIG. 9, reference numeral 7 denotes a silicon oxide film (including an upper oxide film if it is formed on the silicon layer as in the first embodiment) formed by the above thermal oxidation.

After an insulating film such as a silicon oxide film is formed on the entire surface of the resultant structure, a second gate electrode (not shown) made of polysilicon is formed to cover confining potential formation regions at the two ends of the narrow wire portion 10.

As is apparent, this second gate electrode can be processed/formed simultaneously with the first gate electrode 15.

An impurity such as phosphorus or arsenic is doped, at a high concentration, in regions serving as conductive regions by using the first and second gate electrodes as masks, thereby forming low-resistance silicon regions.

Similar to a conventional MOS transistor, windows for electrodes are formed in portions of the silicon oxide film on the electrode portion 11 and the electrode portion 12, and source and drain electrodes are formed in these windows bu using a metal such as aluminum, tungsten, or titanium. Similarly, the drain electrode of the MOS transistor is formed with respect to the electrode portion 14 (a region above the gate electrode 15 in FIG. 8).

With this step, the manufacturing process for a Coulomb-blockade element is completed. As a result, the up side region of the gate electrode 15 in FIG. 8 is formed as a drain region, the region therebelow (on the adjacent portion 13 side) is formed as a source region, and the overlapping region between the electrode portion 14 and the gate electrode 15 is formed as a channel region 17. That is, a MOS transistor capable of ON/OFF-controlling the channel region 17 through the gate electrode 15 is formed on the electrode portion 14.

The above second gate electrode serves to cover the confining potential formation regions at the two ends of the narrow wire portion 10 to prevent a high-concentration impurity from being doped in the regions. This structure prevents the formation of insufficient potential barriers, which are formed when the silicon in these regions are poly-crystallized to be deformed or become metallic.

By adjusting the voltage to be applied to the second gate electrode, the range in which the conductance changes can be controlled, as shown in FIG. 7.

Note that since the range in which the conductance changes can also be controlled by adjusting the back gate voltage to be applied to the silicon substrate 2, the second gate electrode may be omitted in a case wherein the dose of an impurity to be doped is small or depending on a method of doping an impurity.

Even if the narrow wire portion 10 or the adjacent portion 13 becomes metallic, no influence will be recognized. However, in order to prevent a large change in the shape of the portion 10 or 13 due to poly-crystallization, the portion may be protected by the second gate electrode. In this case, the second gate voltage is adjusted to allow charges to be stored in the narrow wire portion 10 or the adjacent portion 13 (to allow the operation of the Coulomb-blockade element). If, however, adjustment is made by applying a back gate voltage to a silicon substrate 2, the second gate electrode is not required.

As is apparent, another insulating mask film can be used as a substitute for the second gate electrode. In this case, the regions serving as conductive regions may also be covered with this mask film. In such a case, adjustment may be made with the back gate voltage.

Instead of doping the impurity described above, the back gate voltage may be set to be a large positive value to induce charges as a whole.

Figure 10:
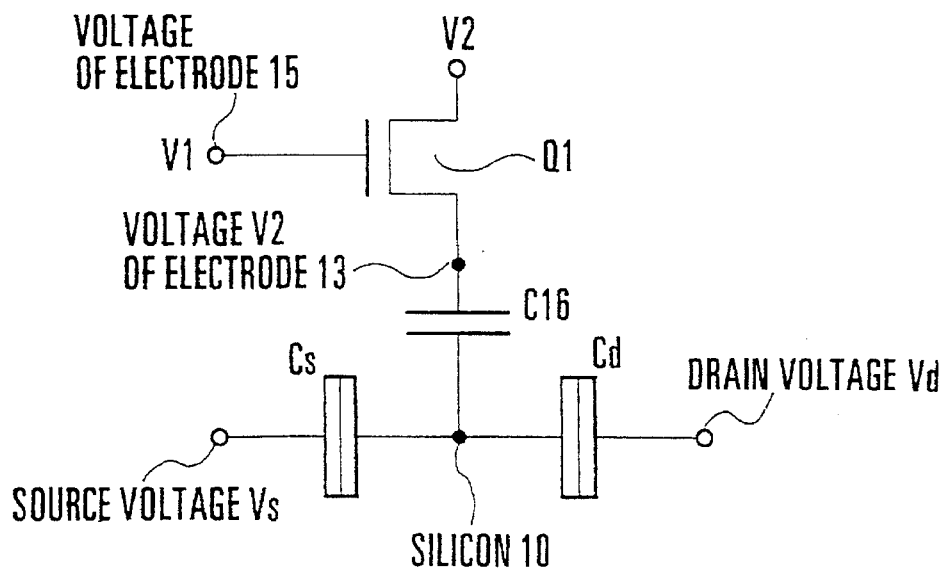
FIG. 10 is an equivalent circuit diagram of the Coulomb-blockade element in FIG. 8.

FIG. 10 shows an equivalent circuit of the Coulomb-blockade element of this embodiment. Reference symbol C16 denotes an electrostatic capacitance based on the space 16 (or an insulating film) between the narrow wire portion 10 and the adjacent portion 13; and Q1, a MOS transistor formed on the electrode portion 14.

The operation principle of this element will be described below.

When information is to be written in this element, a voltage V1 is applied to the first gate electrode 15 to turn on the channel of the MOS transistor Q1.

When source and drain voltages Vs and Vd are fixed to potentials close to the zero potential, and a voltage V2 to be applied to the electrode portion 14 (the drain of the MOS transistor Q1) is set to be negative, electrons in an amount corresponding to the magnitude of the voltage V2 are stored in the adjacent portion 13.

When the voltage V1 is changed to turn off the channel of the MOS transistor Q1, the electrons are held in the adjacent portion 13.

Since the adjacent portion 13 is coupled to the silicon island formed on the narrow wire portion 10 through the electrostatic capacitance C16, the single-electron transistor having the Coulomb-blockade element, as a basic structure, which is constituted by the capacitances Cs, Cd, and C16 around the silicon island operates in accordance with a slight difference in charges stored in the adjacent portion 13. When the voltage Vd is applied to the drain (electrode portion 12), the voltage application appears as a change in conductance.

That is, an output corresponding to the amount of charge stored in the adjacent portion 13 can be extracted as the conductance between the source and the drain (between the electrode portions 11 and 12).

If, therefore, the amount of charge is changed in a digital manner, this Coulomb-blockade element can be used as a general digital memory element.

With the use of a function of measuring the amount of charge in an analog manner, an analog amount can also be stored in the memory. This analog memory can be used as an effective memory device to construct a neuro device (or a neural network). This device uses the characteristic feature that the degree of coupling (using a conductance) between neurons can be changed in accordance with the amount of charge stored in the memory.

Figure 11:
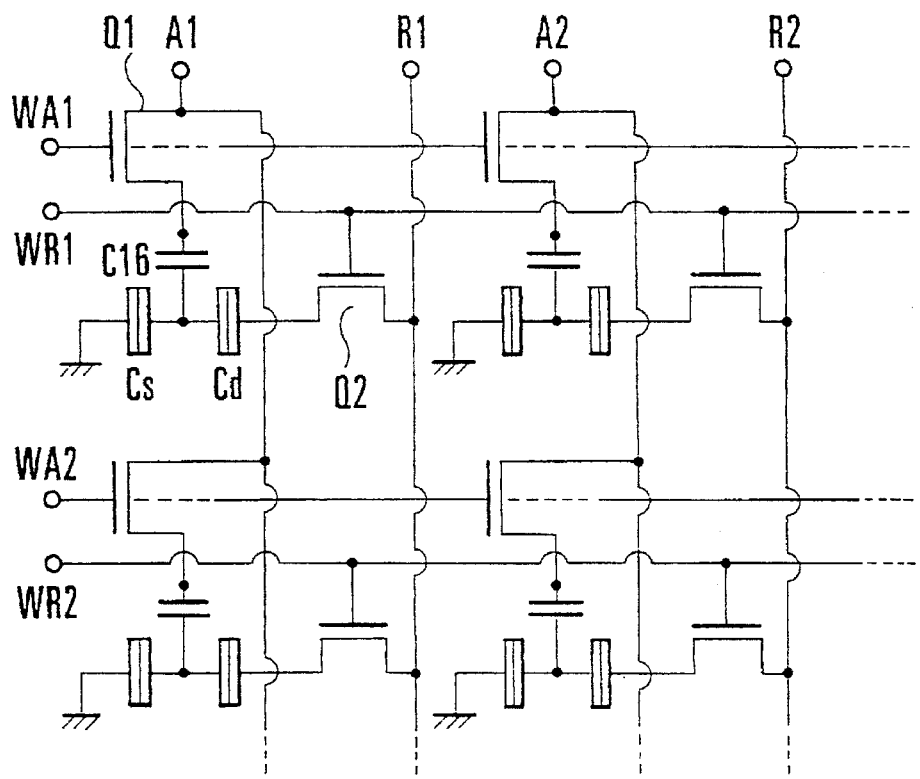
FIG. 11 is a circuit diagram showing a memory element using a plurality of Coulomb-blockade elements, each of which is identical to the one shown in FIG. 8.

If a large number of elements, each identical to the one shown in FIG. 10, are arranged as memory cells in the vertical and horizontal directions, a memory element capable of storing a large amount of data can be obtained. FIG. 11 illustrates one example of this memory element. In the memory element in FIG. 11, since the gate electrodes of MOS transistors Q1 arranged in the lateral direction constitute a common electrode, if the first gate electrode 15 in FIG. 8 is elongated in the lateral direction to be formed as a common gate, the respective cells in the lateral direction can be connected to each other.

In this arrangement, a MOS transistor Q2 serving as a data read switch must be set in the drain portion of each memory cell. For this purpose, an electrode 18 identical to the first gate electrode 15 may be formed to vertically cross the electrode portion 12, as indicated by the broken lines in FIG. 8 (this electrode can be formed simultaneously with the gate electrode 15).

If the transistor Q2 identical to the MOS transistor Q1 is formed and the electrode 18 is elongated in the vertical direction in this manner, the respective cells arranged in the vertical direction can be connected to each other.

When data is to be written in this memory element, a desired one of lines WA1, WA2, . . . is selected, and data is supplied through one of electrodes A1, A2, . . . . When data is to be read out from the memory element, a desired one of lines WR1, WR2, . . . is selected, and a voltage is applied to one of terminals R1, R2, . . . to read the data as a conductance value.

Third Embodiment

In the second embodiment, a MOS transistor is used as a switch for confining stored charges. A structure using a Coulomb-blockade element in place of this MOS transistor will be described next.

Figure 12:
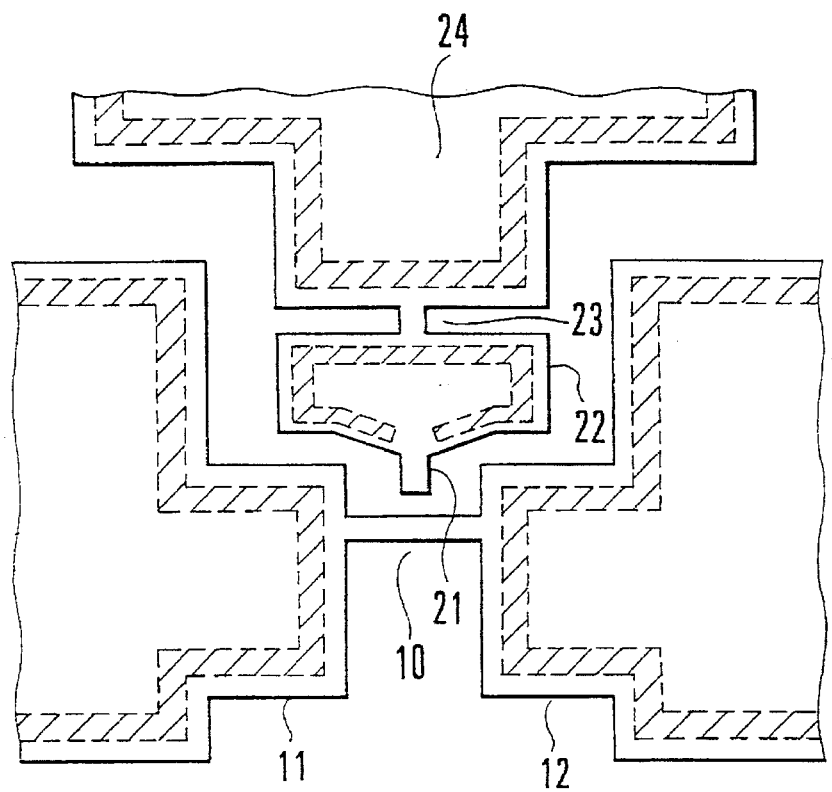
FIG. 12 is a plan view showing a Coulomb-blockade element according to still another embodiment of the present invention.

FIG. 12 shows a Coulomb-blockade element according to still another embodiment of the present invention.

Reference numeral 22 denotes an adjacent portion which is spaced apart from a narrow wire portion 10 through a space for a capacitance or an insulating film, and is also connected to one end of a second narrow wire portion. The adjacent portion 22 is wider than the second narrow wire portion, and a portion of the adjacent portion 22 which is near the second narrow wire portion is thinner than the second narrow wire portion. Reference numeral 23 denotes the second narrow wire portion for confining charges; and 24, a fourth electrode portion 24 formed to be connected to the other end of the second narrow wire portion 23. The fourth electrode portion 24 is wider than the second narrow wire portion 23, and a portion of the fourth electrode portion 24 which is near the second narrow wire portion 23 is thinner than the second narrow wire portion 23.

The steps in manufacturing such a Coulomb-blockade element will be described next. Similar to the first embodiment, an upper silicon layer on an SOI substrate is processed into a shape including the narrow wire portion 10 and first and second electrode portions 11 and 12, each having a width of about 100 nm or more (in the vertical direction in FIG. 12).

At the same time, an upper silicon layer adjacent to this structure is processed into the adjacent portion 22 adjacent to the narrow wire portion 10 and having a width of about 100 nm or more (in the lateral direction in FIG. 12), the second narrow wire portion 23, and the fourth electrode portion 24 having a width of about 100 nm or more (in the lateral direction in FIG. 12).

Referring to FIG. 12, a portion 21 narrower than the adjacent portion 22 is formed thereunder. However, the adjacent portion 22 may be directly formed to be adjacent to the narrow wire portion 10 without forming the portion 21. That is, a condition for this structure may be set such that a capacitance (a capacitance C21 to be described later) to be formed between the narrow wire portion 10 and the adjacent portion 22 is on the order of tunnel capacitances Cs and Cd (i.e., about 1/10 to 10 times the tunnel capacitances Cs and Cd).

When this silicon layer is thermally oxidized in the same manner as in the first embodiment, tunnel barriers are formed in the hatched regions, and the narrow wire portions 10 and 23 are formed into silicon islands with the two ends of each narrow wire portion being located between tunnel barriers.

Windows for electrodes are formed in portions of the silicon oxide films on the electrode portions 11, 12, and 24, and electrodes are formed in the respective windows.

Figure 13:
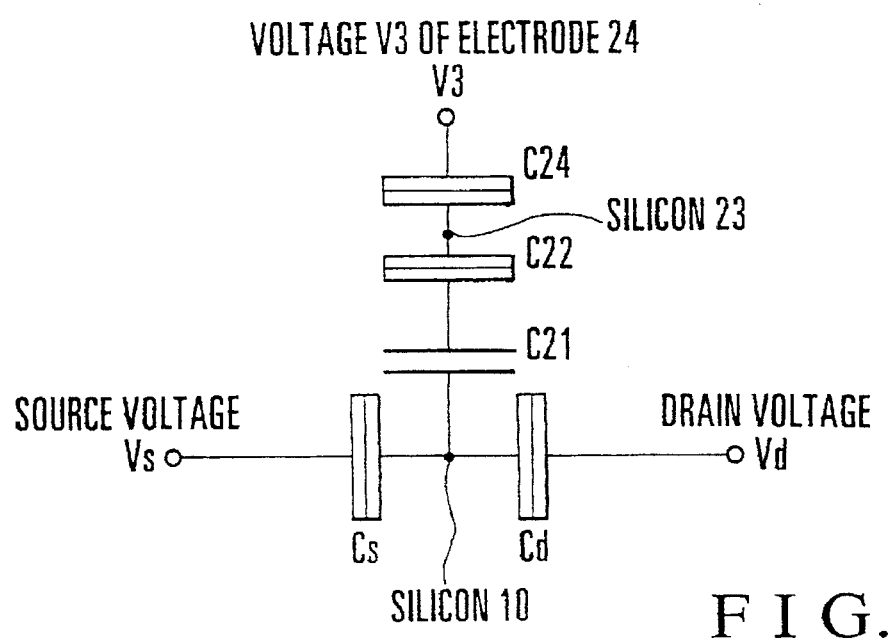
FIG. 13 is an equivalent circuit diagram of the Coulomb-blockade element in FIG. 12.

FIG. 13 shows an equivalent circuit of the Coulomb-blockade element of this embodiment. Reference symbol C21 denotes the electrostatic capacitance based on a space between the narrow wire portion 10 and the adjacent portion 22; and C22 and C24, tunnel capacitances based on the tunnel barriers formed at the two ends of the narrow wire portion 23.

In the embodiment of this embodiment, the MOS transistor Q1 in FIG. 10 is replaced with a Coulomb-blockade element. According to the characteristic feature of this element the silicon island formed on the narrow wire portion 23 forms charge transfer barriers because of the Coulomb-blockade effect. For this reason, when a voltage V3 is applied to the electrode portion 24, the amount of charge (the number of electrons, i.e., the potential of the island) stored in the adjacent portion 22 undergoes a hysteresis. The Coulomb-blockade element uses this hysteresis. That is, the adjacent portion 22 (including the narrow portion 21) can be used as a single-electron memory cell.

When the voltage V3 is applied to the electrode portion 24 to store charges in the silicon island on the narrow wire portion 23, the charges in the silicon island are held even after the electrode portion 24 is set at a voltage of 0.

A switching transistor like the one in the second embodiment is not always required. In order to ensure a proper operation of the Coulomb-blockade element including the narrow wire portions 10 and 23, a voltage may be applied to the back gate (silicon substrate). Alternatively, a gate electrode may be formed to cover the narrow wire portions 10 and 23, and the Coulomb-blockade element may be adjusted by changing the potential of this gate electrode (in this case, an impurity may be doped in portions other than the gate electrode to decrease the resistance).

Fourth Embodiment

FIGS. 14A to 14C show the steps in manufacturing a Coulomb-blockade element according to still another embodiment of the present invention.

Figure 15:
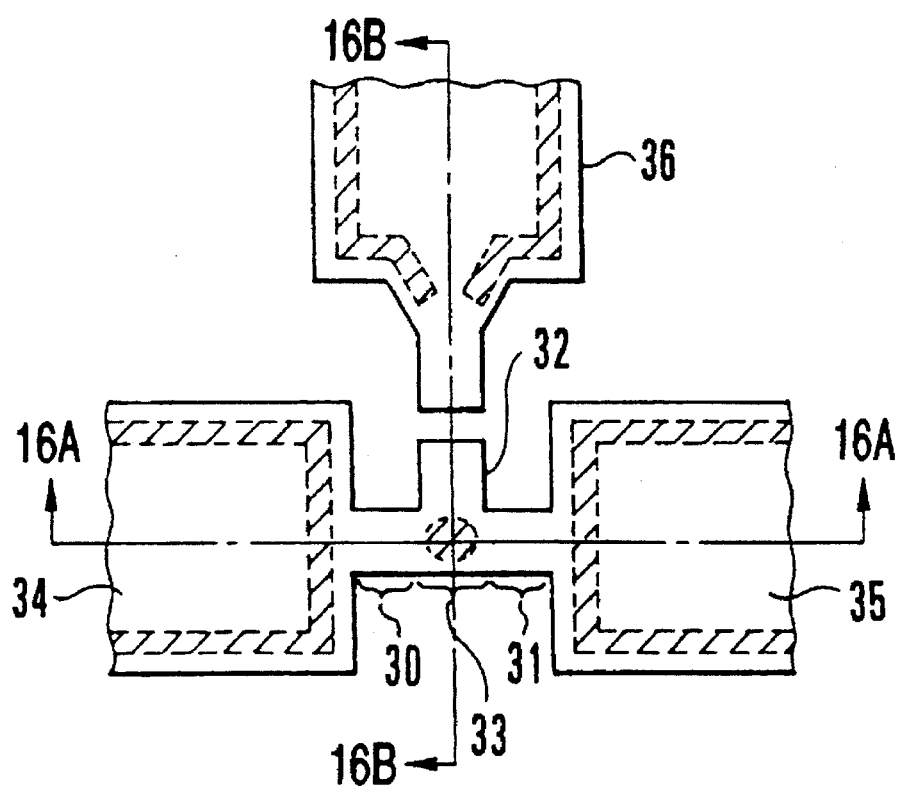
FIG. 15 is a plan view showing the pattern of a silicon layer.

In order to manufacture the Coulomb-blockade element of this embodiment, an upper silicon layer 4 may be processed into a shape like the one indicated by the solid lines in FIG. 15, which includes narrow wire portions 30 to 32, a connecting portion 33 serving a branching point for coupling these narrow wire portions, electrode portions 34 and 35, and an electrode portion 36 formed to be spaced apart from the narrow wire portion through a space for forming a capacitance (FIG. 14C), and the silicon layer may be thermally oxidized in the same manner as in the first embodiment.

Similar to the first embodiment, the silicon layer 4 (the hatched portions in FIG. 15) is thinnest near the pattern edges of the electrode portions 34 to 36.

The connecting portion 33 has an area larger than that of each of the narrow wire portions 30 to 32, and the influence of a stress on the connecting portion 33 is small. For this reason, the silicon layer 4 is thin near the connecting portion 33 as well as the edges.

Figure 16A:
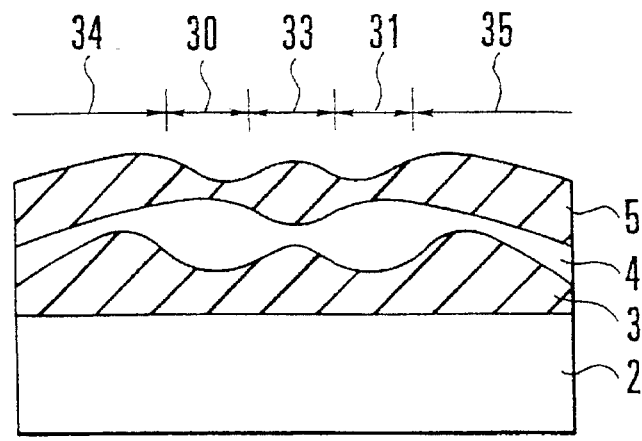
FIGS. 16A and 16B are sectional views taken along lines A—A and B—B of FIG. 15 illustrating the element after thermal oxidation in FIG. 14C.
Figure 16B:
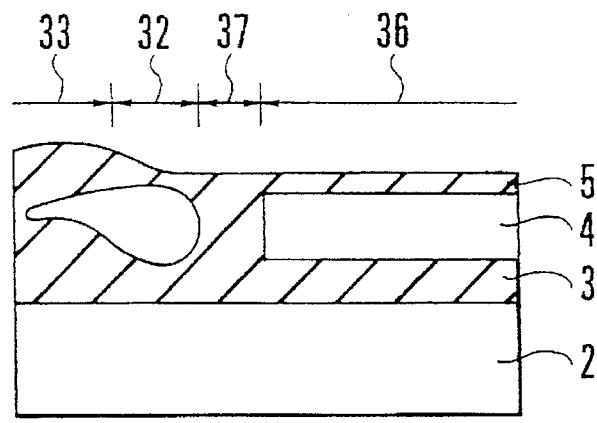

When the element is cut along a line A—A in FIG. 15, a structure like the one shown in FIG. 16A is obtained. When the element is cut along a line B—B in FIG. 15, a structure like the one shown in FIG. 16B is obtained. In this manner, oxidation is made to progress at the hatched portions in FIG. 15, and volume expansion occurs. As a result, as shown in FIGS. 16A and 16B, these portion protrude in the direction of thickness.

Referring to FIG. 16B, reference numeral 37 denotes a region in which an oxide film is formed between the narrow wire portion 32 and the electrode portion 36 by thermal oxidation. In this embodiment, the gap between the narrow wire portion 32 and the electrode portion 36 is completely filled with the side gate oxide film. However, some space may be left between these portions.

Finally, windows for electrodes are formed in portions of an upper layer oxide film 5 on the electrode portions 34, 35, and 36, and electrodes are respectively formed in these windows.

With this step, the manufacturing process for the Coulomb-blockade element is completed.

Figure 17:
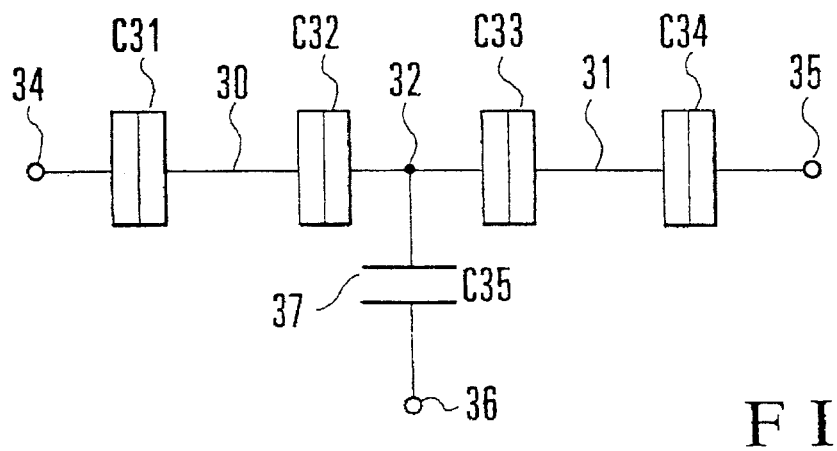
FIG. 17 is an equivalent circuit diagram of the Coulomb-blockade element in FIG. 14.

FIG. 17 shows an-equivalent circuit of the Coulomb-blockade element in FIG. 14. A thin silicon region (a hatched portion in FIG. 15) near the pattern edge of the electrode portion 34 becomes a tunnel barrier owing to an increase in ground energy state. As a result, this region serves as the tunnel capacitance C31. Similarly, a thin silicon region near the pattern edge of the electrode portion 35 becomes a tunnel barrier and serves as a tunnel capacitance C34.

In addition, thin silicon regions formed at the connecting portion 33 become tunnel barriers and serve as tunnel capacitances C32 and C33.

The narrow wire portions 30 to 32 become a silicon island adjacent to the tunnel barriers.

A side gate capacitance C35 consisting of the side gate oxide film 37 is connected to the narrow wire portion 32.

As will be described later, by changing the junction shape between a narrow wire portion and an electrode portion, the electrode can be formed into an electrode portion for single-electron injection/extraction (current injection/extraction) or an electrode portion for single-electron transportation control (voltage application). According to this embodiment, the electrode portions 34 and 35 serve as electrode portions for single-electron injection/extraction, and the electrode portion 36 serves as an electrode portion for single-electron transportation control.

The equivalent circuit of FIG. 17 corresponds to a single-electron turnstile as a coupling structure type Coulomb-blockade element, which includes a plurality of silicon islands.

Figure 18A:
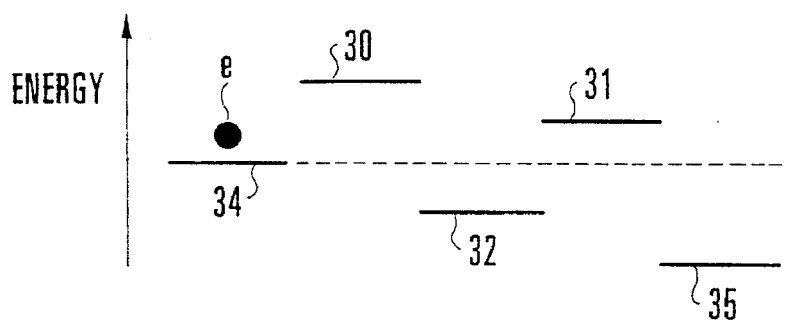
FIGS. 18A to 18C are views illustrating the energy diagram for a single electron between narrow wire portions and electrode portions.
Figure 18B:
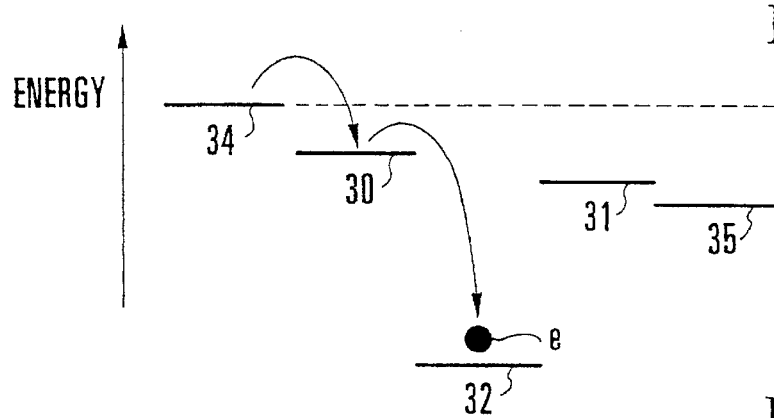
Figure 18C:
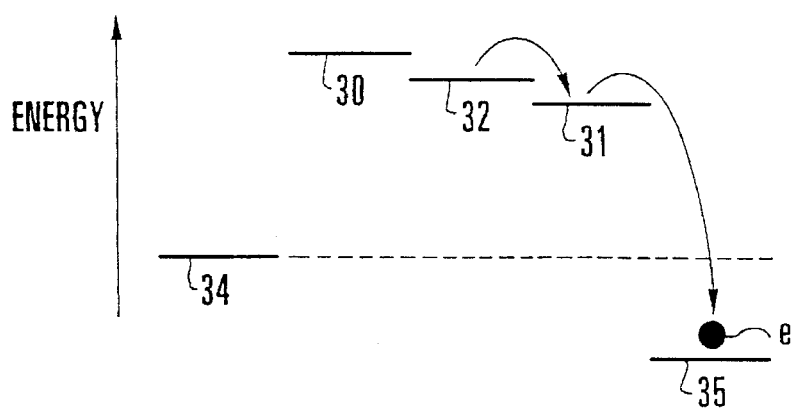

The operation of a Coulomb-blockade element having such an equivalent circuit will be described next. FIGS. 18A to 18C illustrate the relationship between the narrow wire portions 30 to 32, the electrode portions 34 and 35, and the energy of a single electron.

FIG. 18A shows a state wherein a constant voltage is applied between the electrode portions 34 and 35 (the electrode 35 is set to be positive; and the electrode 34, negative).

The energy level of the silicon island 32 is lower than that of each of the silicon islands 30 and 31 for the following reason. The silicon island 30 is surrounded by the tunnel capacitances C31 and C32, and the silicon island 31 is surrounded by the tunnel capacitances C33 and C34. In addition, as will be described later, the narrow wire portions 30 and 31 are formed to be minimized in size. In contrast to this, the capacitance around the silicon island 32, including the side gate capacitance C35, is larger than the silicon islands 30 and 31.

When a voltage is applied to the electrode portion 36 while a constant voltage is applied between the electrode portions 34 and 35, as shown in FIG. 18A, the levels of the silicon islands 30 to 32 rise and fall because of connection through the capacitance C35.

More specifically, when a positive voltage is applied to the electrode portion 36, the levels of the silicon islands 30 to 32 fall. When the level of the silicon island 30 becomes equal to or lower than that of the electrode 34 as the positive voltage increases, a single electron e in the electrode portion 34 moves to the silicon island 30 and to the silicon island 32 having a lower level, as shown in FIG. 18B.

When a negative voltage is applied to the electrode portion 36, the levels of the silicon islands 30 to 32 rise. When the level of the silicon island 31 becomes equal to or lower than that of the silicon island 32 as the negative voltage increases, the single electron e in the silicon island 32 moves to the silicon island 31 and to the electrode portion 35 having a lower level, as shown in FIG. 18C.

By applying an AC voltage to the electrode portion 36 in this manner, one electron can be transported from the electrode portion 34 to the electrode portion 35 through the silicon islands 30, 32, and 31.

Formation conditions for realizing such a coupling structure type Coulomb-blockade element will be described next. In order to realize the function of the above single-electron turnstile at room temperature, the narrow wire portions 30 and 31 must be minimized, and tunnel barriers must be effectively formed.

The dimensions of the narrow wire portions 30 and 31 before thermal oxidation, including thickness, width (in the vertical direction in FIG. 15), and length (in the lateral direction in FIG. 15), are preferably set to be about several tens nm or less.

In order to most effectively form a tunnel barrier at the connection portion 33, the connecting portion 33 needs to have a certain area, in consideration of the oxidation progressing effect and the oxidation suppressing effect described in the first embodiment.

The formation of a tunnel barrier with the most effective progression of oxidation of the connecting portion 33 is dependent on conditions such as an oxidation temperature and an oxidation atmosphere. When, for example, the silicon layer 4 having a thickness of about 20 nm before oxidation is to be oxidized in a dry oxygen atmosphere at 1,000° C., both the width (in the lateral direction in FIG. 15) and length (in the vertical direction in FIG. 15) of the narrow wire portion 32 before oxidation may be set to be about 100 to 200 nm.

The formation of tunnel barriers with the most effective progression of oxidation of the electrode portions 34 and 35 is dependent on conditions such as an oxidation temperature and an oxidation atmosphere. If the same conditions as those for the connecting portion 33 are to be set, the widths (in the vertical direction in FIG. 15) of the electrode portions 34 and 35 may be set to be about 400 nm.

As is apparent, the dimensional design must be optimized in accordance with oxidation conditions and the function of each Coulomb-blockade element.

A method of controlling the formation of silicon islands and the degree of coupling (tunnel capacitance) between the silicon islands, as formation conditions for realizing the Coulomb-blockade element, will be described next. FIGS. 19A to 19F show a Coulomb-blockade element to explain this control. The same reference numerals in FIGS. 19A to 19F denote the same parts as in FIGS. 14A to 14C. FIGS. 19A to 19F, however, show only the silicon layer corresponding to the upper silicon layer 4.

Referring to FIGS. 19A, 19C, and 19E, the hatched portion indicates a region where tunnel barriers are formed, and the dotted portions (to be referred to as satin portions hereinafter) indicate regions where silicon islands are formed.

As shown in FIG. 19A, when the silicon layer is processed into a T shape with the narrow wire portion 32 having a large width W2, and the silicon layer is thermally oxidized, oxidation of the narrow wire portion 32 and the connecting portion 33 is accelerated because their areas are sufficiently large and the effect of a stress thereon is small. In this region, therefore, a tunnel barrier is formed, and no silicon island is formed at the narrow wire portion.

As a result, the equivalent circuit of the element in FIG. 19A becomes a circuit like the one shown in FIG. 19B, in which the two silicon islands 30 and 31 are connected to each other through the tunnel capacitance C36.

As shown in FIG. 19C, when the silicon layer is processed into a T shape with the narrow wire portion 32 having a relatively small width W2, and the silicon layer is thermally oxidized, oxidation of the narrow wire portion 32 is suppressed, as well as oxidation of the narrow wire portions 30 and 31, owing to a stress, and a silicon island is formed. At this time, a tunnel barrier is formed at the connecting portion 33. However, since the distance between the silicon islands 30 and 31 is sufficiently larger than the distance between the silicon islands 30 and 32 or between the silicon islands 31 and 32, the frequency of electron tunneling between the silicon islands 30 and 31 is low, and the corresponding tunnel capacitance C37 becomes small.

As a result, the effective equivalent circuit of the element in FIG. 19C becomes a circuit like the one shown in FIG. 19D, in which the silicon islands 30, 32, and 31 are connected in series. This structure corresponds to the Coulomb-blockade element in FIG. 14C.

If thermal oxidation is performed while the width W2 of the narrow wire portion 32 is set to be small as shown in FIG. 19E, the junction between the silicon islands 30 and 31 cannot be neglected. As a result, the equivalent circuit of the element in FIG. 19E becomes a circuit like the one shown in FIG. 19F, in which the three silicon islands 30 to 32 are connected to each other through the capacitances C32, C33, and C37.

The actual width W2 corresponding to each case is dependent on the conditions such as an oxidation temperature and an oxidation atmosphere. Assume that a silicon layer has a thickness of about 20 nm before oxidation, the width W1 of the narrow wire portions 30 and 31 is about 30 to 40 nm, and a length L1 of the narrow wire portion 32 is about 100 nm. In this case, when this sample is oxidized in a dry oxygen atmosphere at 1,000° C. width W2=about 100 nm or less corresponds to the case in FIG. 19E; with W2=100 nm to several 100 nm, the case in FIG. 19C; and width W2 larger than several 100 nm, the case in FIG. 19A.

The value of W2 as the boundary between the structures in FIGS. 19A and 19C is strongly dependent on the value of the length L1 of the narrow wire portion 32 (if, for example, L2 is about 100 nm as in the above case, W2=about several 100 nm), and the value of W2 as the boundary decreases with an increase in the length L1.

As described above, by Changing the shape or dimensions of a narrow silicon line portion, the manner of the formation of a silicon island or the degree of coupling between silicon islands (the magnitude of a tunnel capacitance) can be controlled.

The connecting portion 33 described in this embodiment is a region having the width W1 in the vertical direction and the width W2 in the lateral direction in FIGS. 19A to 19F.

A method of controlling the junction form of electrodes will be described as a formation condition for realizing a Coulomb-blockade element. FIGS. 20A to 20F show only a silicon layer corresponding to the upper silicon layer 4 in FIGS. 14A to 14C.

As shown in FIG. 20A, when the silicon layer is processed into a shape including a narrow wire portion 38 and an electrode portion 39a having a tapered region whose width decreases toward the narrow wire portion 38, and the silicon layer is thermally oxidized, tunnel barriers are forced near the edges of the electrode portion 39a which are indicated by the hatched portions, but no tunnel barrier is formed near the narrow wire portion 38. The reason for this is that oxidation is suppressed by a stress because the area of the portion in contact with the narrow wire portion 38 is small.

The narrow wire portion 38 and the electrode portion 39a are therefore connected to each other without the mediacy of a tunnel barrier (tunnel capacitance), as shown in FIG. 20B.

The electrode portion 39a having such a form of a function is used as an electrode for single-electron injection/ extraction (current injection/extraction). Note that a tunnel barrier having a low potential may be formed at the tapered region depending on the shape of the tapered region. If, however, this tunnel barrier can be neglected in effect upon application of a voltage, no problem will be posed. Alternatively, the tunnel barrier may be used, as in the case shown in FIG. 20C, which will be described later.

As shown in FIG. 20C, the silicon layer is processed into a shape having the narrow wire portion 38 and an electrode portion 39b, and the silicon layer is thermally oxidized (corresponding to the portions between the narrow wire portion 30 and the electrode portion 34 and between the narrow wire portion 31 and the electrode portion 35 in FIG. 14), a tunnel barrier having a sufficiently high potential is formed near the edge of the electrode portion 39b.

The narrow wire portion 38 and the electrode portion 39b are therefore connected to each other through the tunnel capacitance C38, as shown in FIG. 20D. The electrode portion 39b having such a form of a junction is used as an electrode for single-electron injection/extraction (current injection/extraction).

As shown in FIG. 20E, when the silicon layer is processed into a shake including an electrode portion 39c formed to be spaced apart from the narrow wire portion 38 through a space (corresponding to the portion between the narrow wire portion 32 and the electrode portion 36 in FIG. 1), since the space is filled after the oxidation process, a junction which allows no tunneling is formed.

As shown in FIG. 20F, the narrow wire portion 38 and the electrode portion 39c are connected to each other through a capacitance C39. The electrode portion 39c having such a form of a junction is used as an electrode for controlling the transportation of a single electron by applying a voltage. In addition, the magnitude of the capacitance C39 can be controlled by changing the size of the space. In this case as well, a tunnel barrier having a low potential may be formed near the tapered region.

The function of an electrode portion can be changed by changing the form of the junction in this manner.

Such an electrode structure can be applied to the shape of a distal end of the adjacent portion 13 which is adjacent to the narrow wire portion 10 in the second embodiment in FIG. 8 or the shape of the connecting portion between the adjacent portion 22 and the narrow portion 21 formed thereunder. In either of the embodiments, the same function can be obtained by using either the shape in FIG. 20C or the shape in FIG. 20A. As is apparent from FIGS. 20A to 20F, there are two different equivalent circuits corresponding to a case wherein a tunnel capacitance is to be added (the structure in FIG. 20C) and a case wherein a tunnel capacitance is not added (the structure in FIG. 20A). One of the structures which is more effective than the remaining ones is selected in accordance with the magnitude of each constituent capacitance (determined by the size of each portion), operation conditions (the set values of voltage and current), and the machine to which the selected structure is to be applied.

In addition, the shapes of the above silicon islands and tunnel barriers and the potentials of the tunnel barriers are controlled by the above formation conditions and are also dependent on conditions (an oxidation temperature and an oxidation time) for an oxidation process.

Since the oxidation suppressing effect based on a stress becomes more conspicuous as the oxidation temperature drops, the difference in silicon film thickness between a region in which a silicon island is formed and a region in which a tunnel barrier is formed can be increased.

Fifth Embodiment

In the fourth embodiment, the electrode portion 36 formed as a single-electron transportation control electrode by using the upper silicon layer. However, a gate electrode may be formed by using a polysilicon or the like to cover all or some of the narrow wire portions 30 to 32 and the connecting portion 33 through a gate insulating film. This gate electrode may be used as a single-electron transportation control electrode in place of the electrode portion 36. In this case, the upper oxide film 5 is used as a gate insulating film (corresponding to the capacitance C35).

Sixth Embodiment

Figure 21A:
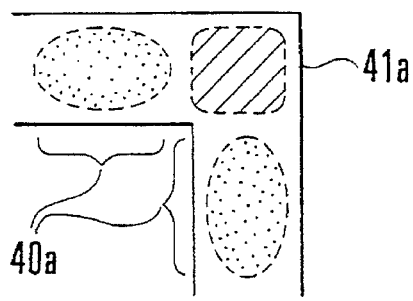
FIGS. 21A to 21C are plan views showing Coulomb-blockade elements according to still another embodiment of the present invention.
Figure 21B:
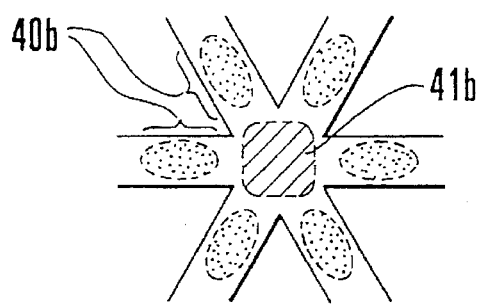
Figure 21C:
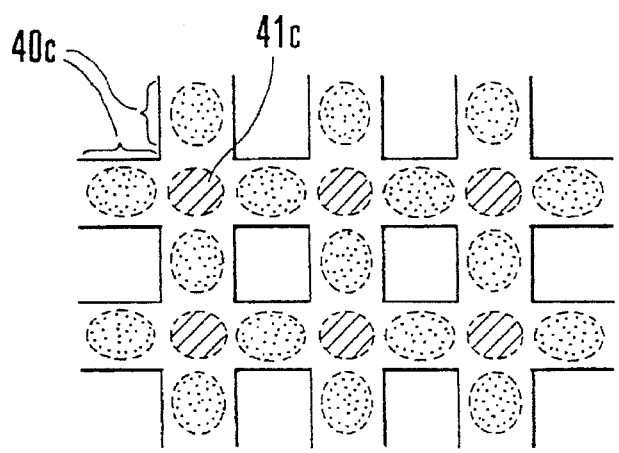

FIGS. 21A to 21C show a Coulomb-blockade element according to still another embodiment of the present invention. The hatched portions indicate regions in which tunnel barriers are formed, and the satin portions indicate regions in which silicon islands are formed.

As shown in FIG. 21A, when a silicon layer is processed into an L shape including two narrow wire portions 40a and a connecting portion 41a as a bending point where the two narrow wire portions are connected to each other, and the silicon layer is thermally oxidized, a tunnel barrier is formed at the connecting portion 41a and silicon islands are formed on the two narrow wire portions 40a.

As shown in FIG. 21B, when a silicon layer is processed into a radial shape including a connecting portion 41b and six narrow wire portions 40b radially extending from the connecting portion 41b, and the silicon layer is thermally oxidized, a tunnel barrier is formed at the connecting portion 41b, and silicon islands are formed on the narrow wire portions 40b.

Alternatively, a silicon layer may be processed into a matrix shape including narrow wire portions 40c and connecting portions 41c are arranged as shown in FIG. 21C, and the silicon layer may be thermally oxidized.

Although no electrode portions connected to the ends of the narrow wire portions 40a to 40c are described in this embodiment, a closed state like the narrow wire portion 32 in the first embodiment may be formed, or electrode portions may be connected as shown in FIGS. 20A to 20F. Alternatively, a gate electrode may be formed as in the fifth embodiment.

As is apparent, the structures shown in FIGS. 21A to 21C can be coupled to each other to form a new array.

Seventh Embodiment

In the fourth to sixth embodiments, although all the patterns are constituted by straight lines, the patterns may be constituted by curves. By using curves, the degree of freedom in the design of the shapes of narrow wire portions and the like further increases. As a result, variations of coupling structures which can be put to practical use further increase.

Eighth Embodiment

FIG. 22 shows a Coulomb-blockade element according to still another embodiment of the present invention. The same reference numerals in FIG. 22 denote the same parts as in FIGS. 14A to 14C. However, FIG. 22 shows only a silicon layer corresponding to the upper silicon layer 4.

In order to manufacture such a Coulomb-blockade element, the silicon layer may be processed into a shape like the one indicated by the solid lines in FIG. 22, and the silicon layer may be thermally oxidized in the same manner as in the first embodiment.

With this process, tunnel barriers are formed in the hatched regions, and silicon islands are formed in the regions indicated by the satin portions. Window are formed in portions of oxide films on electrode portions 34, 36, 43, and 44, and extraction electrodes are respectively formed in the windows. Note that no extraction electrode is formed on an adjacent portion 35a connected to a single-electron transistor (to be described later) through a space, because the adjacent portion 35a serves as a silicon island used as a single-electron memory cell.

In this manner, the electrode portions 34, 43, and 44 become single-electron injection/extraction electrodes, and the electrode portion 36 becomes a single-electron transportation control electrode.

FIG. 23 shows an equivalent circuit of the Coulomb-blockade element in FIG. 22. In this Coulomb-blockade element, a single-electron turnstile Q31 is connected, as a single-electron write line similar to the one in the first embodiment, to a silicon island formed on the adjacent portion 35a and serving as a single-electron memory cell, and a single-electron transistor Q32 constituted by a narrow wire portion and the electrode portions 43 and 44 is also connected, as an electrode read line, to the silicon island.

In this Coulomb-blockade element, when the electrode portion 34 is set at an appropriate negative voltage, and an AC voltage is applied to an electrode portion 36, electrons can be injected one by one into the silicon island formed on the adjacent portion 35a. The number of electrons in this silicon island can be read as a change in the conductance between the electrode portions 43 and 44 in the single-electron transistor Q32.

Ninth Embodiment

FIG. 24 shows a Coulomb-blockade element according to still another embodiment of the present invention. However, FIG. 24 shows only the silicon layer corresponding to the upper silicon layer 4 in FIGS. 14A to 14C.

In order to manufacture such a Coulomb-blockade element, the silicon layer may be processed into a shape like the one indicated by the solid lines in FIG. 24, and the silicon layer may be thermally oxidized in the same manner as in the first embodiment.

With this process, tunnel barriers are formed in the hatched regions, and silicon islands are formed in the regions indicated by the satin portions. Windows are formed in portions of oxide films on electrode portions 45 and 48 to 50, and electrodes are respectively formed in the windows. As a result, the electrode portions 45 and 48 serve as single-electron injection/extraction electrodes, and the electrode portions 49 and 50 serve as single-electron transportation control electrodes.

FIG. 25 shows an equivalent circuit of this Coulomb-blockade element. This coupling structure type Coulomb-blockade element is called a single-electron pump.

Figure 27A:
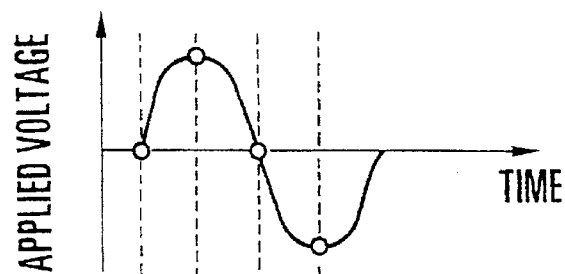
FIGS. 27A and 27B are graphs showing the waveforms of voltages applied to electrode portions for single-electron transportation control in FIG. 24.
Figure 27B:
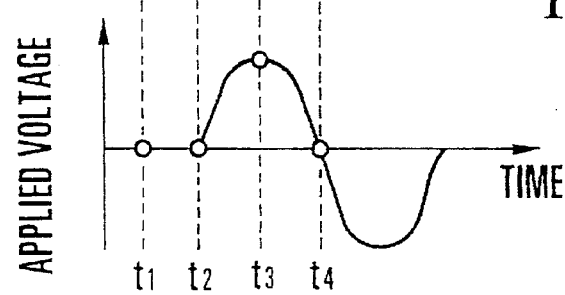

The operation of the Coulomb-blockade element having such an equivalent circuit will be described next. FIG. 26 illustrates the relationship between the narrow wire portions 46 and 47, the electrode portions 45 and 48, and the energy of a single electron. FIGS. 27A and 27B respectively show the waveforms of voltages to be applied to the electrode portions 49 and 50.

In this Coulomb-blockade element, a constant voltage need not be applied between the electrode portions 45 and 48, unlike in a single-electron turnstile.

FIG. 26A shows an initial state (time t1 in FIGS. 27A and 27B). When the positive voltage applied to the electrode portion 49 rises at time t2 in FIG. 27A, a single electron in the electrode portion 45 moves to the silicon island 46, as shown in FIG. 26B.

When the voltage applied to the electrode portion 49 approaches 0 at time t3, the electron e in the silicon island 46 tries to return to the electrode portion 45. However, as shown in FIG. 27B, since the positive voltage applied to the electrode portion 50 rises, the single electron e in the silicon island 46 moves to the silicon island 47, as shown in FIG. 26C.

Finally, when the voltage applied to the electrode portion 50 becomes 0 at time t4, and the voltage applied to the electrode portion becomes negative, the single electron e moved to the electrode portion 48.

As described above, by applying AC voltages, which are out of phase, to the electrode portions 49 and 50, one electron can be transported from the electrode portion 45 to the electrode portion 48 through the silicon islands 46 and 47.

Tenth Embodiment

Figure 28:
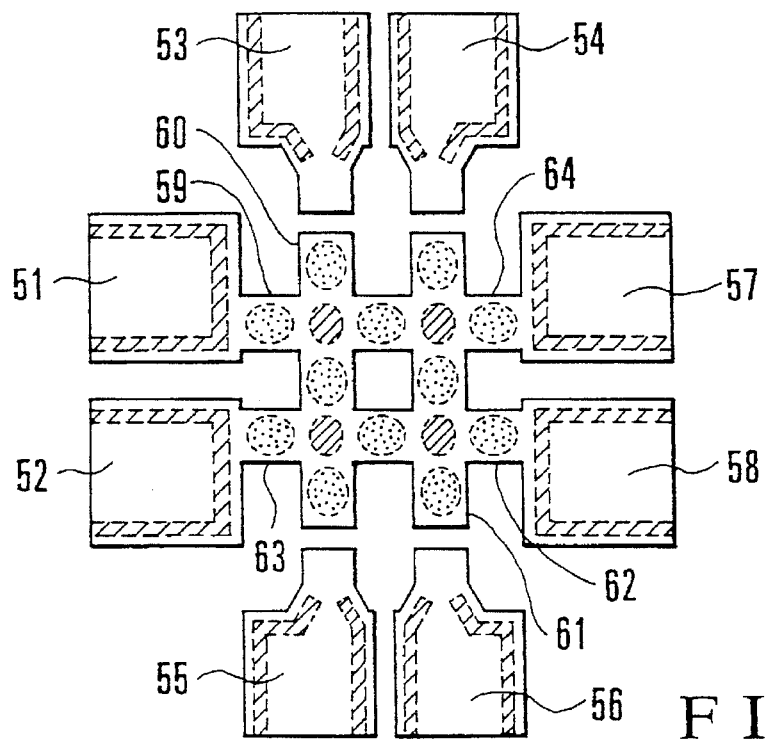
FIG. 28 is a plan view showing a Coulomb-blockade element according to still another embodiment of the present invention.

FIG. 28 shows a Coulomb-blockade element according to still another embodiment of the present invention. FIG. 28 shows only the silicon layer corresponding to the upper silicon layer 4 in FIGS. 14A to 14C.

In order to manufacture such a Coulomb-blockade element, the silicon layer may be processed into a shape like the one indicated by the solid lines in FIG. 28, and the silicon layer may be thermally oxidized in the same manner as in the first embodiment.

With this progress, tunnel barriers are formed in the hatched regions, and silicon islands are formed in the regions indicated by the satin portions. Windows are formed in oxide films on electrode portions 51 to 58, and electrodes are formed in the respective windows. The electrode portions 51, 52, 57, and 58 become single-electron injection/extraction electrodes, and the electrode portions 53 to 56 become single-electron transportation control electrodes.

FIG. 29 shows an equivalent circuit of this Coulomb-blockade element. The coupling structure type Coulomb-blockade element is a single-electron transportation circuit having two inputs (electrode portions 51 and 52) and two outputs (electrode portions 57 and 58).

The operation of the Coulomb-blockade element having this equivalent circuit will be described next. Assume that a single electron is to be transported from the electrode portion 51 to the electrode portion 58. FIGS. 30A to 30D show the waveforms of voltages applied to the electrode portions 53 to 56.

Figure 30A:
FIGS. 30A to 30D are timing charts showing the waveforms of voltages applied to electrode portions for single-electron transportation control in FIG. 28.
Figure 30B:
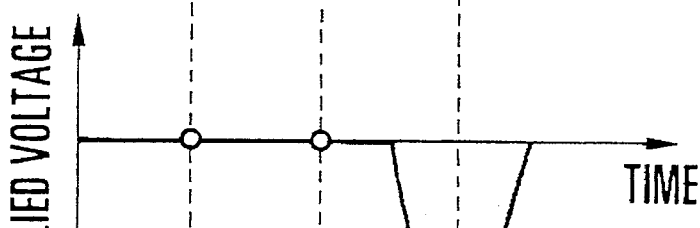
Figure 30C:
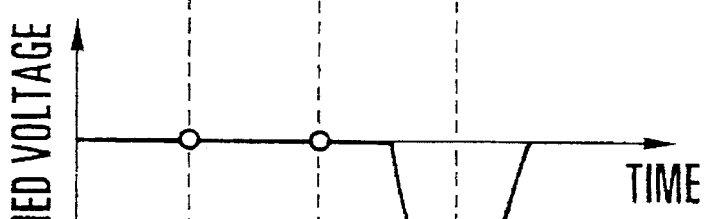

When the positive voltage applied to the electrode portion 53 rises at time t1 in FIG. 30A, a single electron e in the electrode portion 51 moves to a narrow wire portion 60 through a silicon island formed on a narrow wire portion 59, as indicated by the broken lines in FIG. 29.

Figure 30D:
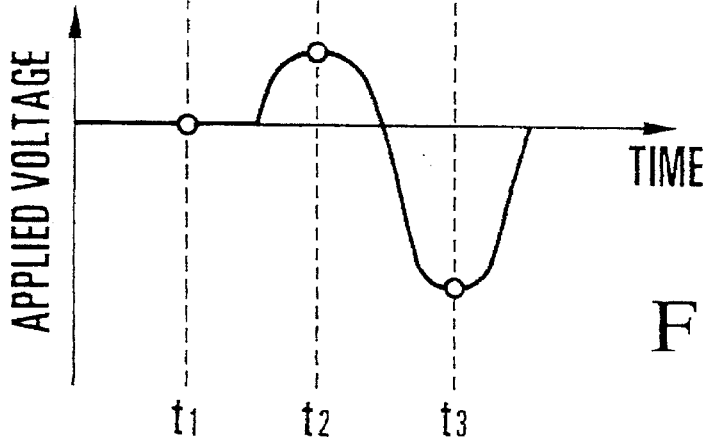

When a negative voltage is applied to the electrode portion 53 at time t2, and at the same time, a positive voltage is applied to the electrode portion 56 as shown in FIG. 30D, the single electron e moves from the silicon island on the narrow wire portion 60 to a silicon island formed in a narrow wire portion 61.

Finally, when negative voltages are applied to the electrode portions 53 to 56 at time t3, the single electron e moves to the electrode portion 58.

By applying AC or pulse-like voltages to the electrode portions 53 to 56 with proper phases or at proper timings with respect to the input voltages to the electrode portions 51 and 54, transportation of single electrons from the electrodes 51 and 52 to the electrodes 57 and 58 can be realized. A function of an output with respect to an input can be controlled by controlling the magnitude, phase, and timing of AC or pulse-like voltages applied to the electrode portions 53 to 56, respectively. In order to realize this function, four silicon islands 59 and 62 to 64 which are in contact with the electrode portions 51, 52, 57, and 58 must be formed to be smaller than other silicon islands.

Eleventh Embodiment

Each embodiment described above uses an SOI substrate having single crystalline silicon formed on a silicon oxide film. The same principle is established when an amorphous or polysilicon layer is formed on a silicon oxide film. The same effects as those described above can be obtained by using such a substrate as long as techniques and structures similar to those in the first to 10th embodiments are used.

Twelfth Embodiment

In each embodiment described above, thermal oxidation is performed while an upper oxide film used as a mask in forming a pattern of an upper silicon layer. As is apparent, however, if a resist film or the like is used as another mask film in place of the upper oxide film, since the mask film can be selectively removed after the silicon layer is processed, the upper oxide film need not be used.

In each embodiment described above, an upper oxide film having a thickness of about 30 nm is formed on an upper silicon layer. If, however, the thickness of this upper oxide film is increased to about 60 nm, an oxidant passing through the upper oxide film decreases in amount to suppress oxidation from above, and oxidation from below, which is based on the diffusion of the oxidant in the lateral direction, becomes dominant. Therefore, tunnel barriers are formed at the two ends of a narrow wire portion while oxidation from the upper side of a flat portion serving as an electrode (the upper silicon layer spaced apart from and edge) is suppressed (almost no oxidation occurs from below because of a long distance from the edge). That is, since oxidation of the silicon layer from above is suppressed, an oxidation amount and a silicon layer to be finally left can be easily set. In addition, since the upper oxide film is thick, the stress accompanying oxidation increases. This allows effective formation of a constriction.

Similarly, if a silicon nitride film is used in place of an upper oxide film as a mask film or a silicon nitride film is stacked on the upper oxide film, downward oxidation through the nitride film can be suppressed when thermal oxidation as the next step is performed. For this reason, only oxidation from a side wall of the upper silicon layer and from the buried oxide film side mainly occurs, and a reduction in the silicon layer by the downward oxidation does not almost occur. This method is therefore more effective than the above method of using only a silicon oxide film. In addition, since the stress based on the silicon nitride film is large, the stress accompanying oxidation increases. This method is therefore effective in obtaining the structure in each embodiment described above.

According to the present invention, portions of first and second electrode portions which are near a narrow wire portion are made thinner than the narrow wire portion by forming constrictions on the upper and/or lower surfaces of the electrode portions. As a result, tunnel barriers having a higher energy than that of the narrow wire portion are formed at the two ends of the narrow wire portion, and a conductive island is formed on the narrow wire portion. Therefore, a Coulomb-blockade element which operates at a high temperature can be easily realized. In addition, since a conventional silicon MOS structure can be used, a manufacturing process technique for a silicon-based integrated circuit can be used. For this reason, a Coulomb-blockade element can be mounted on the same substrate on which the conventional silicon-based integrated circuit is mounted, thereby realizing a large-scale circuit combining the MOS and Coulomb-blockade devices.

By forming a third electrode portion serving as the drain, source, and channel regions of a MOS transistor to be adjacent to a narrow wire portion, a Coulomb-blockade element serving as a memory element, with the Coulomb-blockade element being capacitively connected to the MOS transistor, can be easily realized.

By forming an adjacent portion to be adjacent to a first narrow wire portion, a Coulomb-blockade element constituted by the first narrow portion and first and second electrode portions is capacitively coupled to a Coulomb-blockade element constituted by a second narrow wire portion, an adjacent portion, and a fourth electrode portion, thereby easily realizing a Coulomb-blockade element serving as a memory element.

By processing a silicon layer into a shape including a narrow wire portion and first and second electrode portions, and thermally oxidizing the silicon layer, a constriction having the minimum thickness is automatically formed at a portion of each electrode portion which is near the narrow wire portion. As a result, tunnel barriers are formed near the narrow wire portion, and a conductive island is formed on the narrow wire portion. Since the size of the conductive island in the lateral direction can be set regardless of the size of each constriction, the conductive island can be reduced in size. In addition, the conductive island can be further reduced in size by thermal oxidation. Therefore, a Coulomb-blockade element which operates at a high temperature can be realized by a simple manufacturing process similar to a conventional manufacturing process technique for a silicon-based integrated circuit. Furthermore, the formation of each constriction can be controlled in accordance with the dimensions of a pattern of each electrode portion and the shape of each constriction. Since a thermal oxidation technique of the silicon LSI process techniques exhibits good controllability and good reproducibility, a Coulomb-blockade element can be realized with good controllability and good reproducibility.

By forming a plurality of narrow wire portions and a connecting portion, and making the connecting portion thinner than each narrow wire portion, a tunnel barrier is formed at the connecting portion and a conductive island is formed on each narrow wire portion, thereby forming a structure in which the conductive islands are coupled to each other through a capacitance based on the tunnel barrier. Therefore, a coupling structure type a Coulomb-blockade element which operates at a high temperature can be easily realized. If narrow wire portions and a connecting portion are designed on a two-dimensional plane, a coupling structure type Coulomb-blockade element having conductive islands arranged within the two-dimensional plane can be manufactured with a high degree of freedom. In addition, since a manufacturing process for a silicon MOS can be used, the coupling structure type Coulomb-blockade element can be mounted on the same substrate on which a conventional silicon integrated circuit is mounted. Therefore, a large-scale, high-performance circuit can be realized by hybridizing a Coulomb-blockade element and a conventional MOS circuit.

When at least one electrode portion wider than a narrow wire portion is formed to be connected to an end of the narrow wire portion, this electrode portion can be used as a single-electron injection electrode.

Since a tunnel barrier is formed at a portion of an electrode portion which is near a narrow wire portion by making the portion of the electrode portion which is near the narrow wire portion thinner than the narrow wire portion, the narrow wire portion as a conductive island can be connected to the electrode portion serving as the single-electron injection/extraction electrode through a capacitance based on the tunnel barrier.

When at least one electrode portion having a smaller width than that of a narrow wire portion, which is formed to be spaced apart from the narrow wire portion through a space or an insulating film for forming a capacitance, this electrode portion can be used as a single-electron transportation control electrode, and the narrow wire portion serving as a conductive island and the narrow wire portion can be connected to each other through a capacitance based on a space or an insulating film.

By forming a gate electrode on at least part of a narrow wire portion and a connecting portion through an insulating film, the narrow wire portion serving as a conductive island can be connected to the gate electrode serving as a single-electron transportation control electrode through a capacitance based on the insulating film.

By processing a silicon layer into a plurality of narrow wire portions and a connecting portion, and thermally oxidizing the silicon layer, a constriction having the minimum thickness is automatically formed at the connecting portion. As a result, a tunnel barrier is formed at the connecting portion, and conductive islands are formed on the narrow wire portions, thereby forming a structure in which the conductive islands are coupled to each other through a capacitance based on the tunnel barrier. Therefore, a coupling structure type Coulomb-blockade element which operates at a high temperature can be realized by a simple manufacturing process similar to a manufacturing process technique for a conventional silicon-based integrated circuit. In addition, the formation of a constriction can be controlled in accordance with pattern dimensions and thermal oxidation conditions, and a thermal oxidation technique of the silicon LSI process techniques exhibits good controllability and good reproducibility. Therefore, a coupling structure type Coulomb-blockade element can be realized with good controllability and good reproducibility.

By forming at least one electrode portion connected to an end of a narrow wire portion and having a width smaller than that of the narrow wire portion is formed on a silicon layer before a thermal oxidation step, and thermally oxidizing the silicon layer, a constriction having the minimum thickness is automatically formed at a portion of the electrode portion which is near the narrow wire portion, and a tunnel barrier is formed near the narrow wire portion. Therefore, a structure in which the conductive island is connected to the electrode portion through a tunnel capacitance can be realized with good controllability and good reproducibility.

At least one electrode portion which is wider than a narrow wire portion and connected to an end of the narrow wire portion such that the width of the electrode portion increases as it is separated from the narrow wire portion is formed on a silicon layer before a thermal oxidation step, and the silicon layer is thermally oxidized. As a result, an electrode portion having no constriction can be realized, and a structure in which the conductive island is coupled to the electrode portion without any tunnel capacitance can be realized with good controllability and good reproducibility.

When an insulating film containing silicon is formed on a silicon layer before a thermal oxidation step, the stress accompanying oxidation changes in accordance with the thickness of this insulating film. Therefore, the formation of a constriction can be controlled.

By using a silicon nitride film as an insulating film containing a silicon, a silicon layer can be oxidized only from below. As a result, the oxidation amount and the thickness of the remaining silicon film can be easily designed. In addition, the formation of a constriction is accelerated because of the stress caused by the silicon nitride film.

What is claimed is:

1. A Coulomb-blockade element comprising:

a silicon layer formed on a substrate through an insulating film, said silicon layer including a narrow wire portion serving as a conductive island for confining a charge, and first and second electrode portions which are formed to be connected to two ends of said narrow wire portion and are wider than said narrow wire portion, each of said first and second electrode portions having constrictions on at least one of upper and lower surfaces thereof, which make a portion near said narrow wire portion thinner than said narrow wire portion.

2. A Coulomb-blockade element comprising:

a silicon layer formed on a substrate through an insulating film, said silicon layer including a narrow wire portion serving as a conductive island for confining a charge, first and second electrode portions which are formed to be connected to two ends of said narrow wire portion and are wider than said narrow wire portion, each of said first and second electrode portions having constrictions on at least one of upper and lower surfaces thereof, which make a portion near said narrow wire portion thinner than said narrow wire portion, and a third electrode portion formed to be spaced apart from said narrow wire portion through a space or an insulating film for forming a capacitance and serving as drain, source, and channel regions of a MOS transistor, wherein a gate electrode of a MOS transistor is formed on a portion of said third electrode portion through an insulating film.

3. A Coulomb-blockade element comprising:

a silicon layer formed on a substrate through an insulating film, said silicon layer including a first narrow wire portion serving as a conductive island for confining a charge, first and second electrode portions which are formed to be connected to two ends of said first narrow wire portion and are wider than said first narrow wire portion, each of said first and second electrode portions having constrictions on at least one of upper and lower surfaces thereof, which make a portion near said first narrow wire portion thinner than said first narrow wire portion, a second narrow wire portion serving as a conductive island for confining a charge, an adjacent portion which is formed to be spaced apart from said first narrow wire portion through a space or an insulating film for forming a capacitance and to be in contact with one end of said second narrow wire portion, and is wider than said second narrow wire portion, said adjacent portion having constrictions on upper and lower surfaces thereof, which make a portion near said second narrow wire portion thinner than said second narrow wire portion, and a fourth electrode portion which is formed to be connected to the other end of said second narrow wire portion and is wider than said second narrow wire portion, said fourth electrode portion having constrictions on at least one of upper and lower surfaces thereof, which make a portion near said second narrow wire portion thinner than said second narrow wire portion.

4. A Coulomb-blockade element comprising:

a silicon layer formed on a substrate through an insulating film, said silicon layer including a plurality of narrow wire portions serving as conductive islands for confining charges, and a connecting portion formed as a branching or bending point for coupling said narrow wire portions to each other, said connecting portion having constrictions on at least one of upper and lower surfaces thereof, which make a portion near said narrow wire portion thinner than said narrow wire portion.

5. An element according to claim 4, further comprising at least one electrode portion which is formed to be connected to an end of said narrow wire portion and is wider than said narrow wire portion.

6. An element according to claim 5, wherein said electrode portion has constrictions on at least one of upper and lower surfaces thereof to make said electrode portion thinner than said narrow wire portion at a position near said narrow wire portion.

7. An element according to claim 4, further comprising at least one electrode portion which is formed to be spaced apart from said narrow wire portion through a space or an insulating film for forming a capacitance and is wider than said narrow wire portion.

8. An element according to claim 4, further comprising a gate electrode formed on at least portions of upper surfaces of said narrow wire portions and said connecting portion through an insulating film.

* * * * *

UNITED STATES PATENT AND TRADEMARK OFFICE
CERTIFICATE OF CORRECTION

PATENT NO. : 5,665,979
DATED : September 9, 1997
INVENTOR(S) : Takahashi et al.

It is certified that error appears in the above-identified patent and that said Letters Patent is hereby corrected as shown below:

In column 4 at line 1, please delete " FIGS. 26D to 26 D " and insert -- FIGS. 26A to 26D --.

In column 7 at line 8, please delete " is and " and insert -- island --.

In column 14 at lines 56 and 63, column 20 at lines 11, 14, 19, and 65, and column 21 at line 2, please delete " e " and insert -- e --.

In column 21 at line 44, please delete " and " and insert -- an --.

Signed and Sealed this

Twenty-ninth Day of December, 1998

Attest:

BRUCE LEHMAN

*Attesting Officer*          *Commissioner of Patents and Trademarks*